(12) United States Patent
Kiest et al.

(10) Patent No.: US 6,547,409 B2
(45) Date of Patent: Apr. 15, 2003

(54) METHOD AND APPARATUS FOR ILLUMINATING PROJECTING FEATURES ON THE SURFACE OF A SEMICONDUCTOR WAFER

(75) Inventors: Cary S. Kiest, Albany, OR (US); William F. Lenzke, Jr., Salem, OR (US)

(73) Assignee: Electroglas, Inc., Corvallis, OR (US)

( * ) Notice: Subject to any disclaimer, the term of this patent is extended or adjusted under 35 U.S.C. 154(b) by 175 days.

(21) Appl. No.: 09/759,792

(22) Filed: Jan. 12, 2001

(65) Prior Publication Data

US 2002/0093812 A1 Jul. 18, 2002

(51) Int. Cl.⁷ .............................. F21V 13/00; G06K 9/00
(52) U.S. Cl. ...................... 362/33; 362/252; 382/145; 382/149
(58) Field of Search ......................... 362/33, 295, 252, 362/249, 234; 382/145, 147, 149

(56) References Cited

U.S. PATENT DOCUMENTS

| | | | |
|---|---|---|---|
| 4,655,592 A | * 4/1987 | Allemand | 356/237 |
| 5,018,803 A | 5/1991 | Hecker et al. | |
| 5,118,192 A | 6/1992 | Chen et al. | |
| 5,465,152 A | 11/1995 | Bilodeau et al. | |
| 5,574,801 A | 11/1996 | Collet-Beillon | |
| 5,600,150 A | 2/1997 | Stern et al. | |
| 5,691,544 A | 11/1997 | Stern et al. | |
| 5,761,337 A | 6/1998 | Nishimura et al. | |
| 5,793,051 A | 8/1998 | Stern et al. | |
| 5,818,061 A | 10/1998 | Stern et al. | |
| 5,828,449 A | 10/1998 | King et al. | |
| 6,055,054 A | 4/2000 | Beaty et al. | |
| 6,066,857 A | 5/2000 | Fantone et al. | |
| 6,072,898 A | 6/2000 | Beaty et al. | |
| 6,075,883 A | 6/2000 | Stern et al. | |
| 6,084,397 A | 7/2000 | Downes | |
| 6,098,887 A | 8/2000 | Figarella et al. | |
| 6,167,148 A | * 12/2000 | Calitz et al. | 382/145 |
| 6,324,298 B1 | * 11/2001 | O'Dell et al. | 382/149 |
| 6,424,733 B2 | * 7/2002 | Langley | 382/145 |
| 6,454,437 B1 | * 9/2002 | Kelly | 362/246 |

* cited by examiner

Primary Examiner—Sandra O'Shea
Assistant Examiner—Ronald E. DelGizzi
(74) Attorney, Agent, or Firm—Klarquist Sparkman LLP

(57) ABSTRACT

Plural light sources are provided for directing ring patterns of light toward at least one reflective bump formed on and projecting from a first wafer surface of a semiconductor wafer. The intensity of light from the light sources may be varied and may be varied independently of one another.

35 Claims, 22 Drawing Sheets

SIDE VIEW OF RING/WAFER GEOMETRY

REFLECTION GEOMETRY FOR THE 20 DEGREE RING

EMBEDDED CONTROLLER PROGRAM FLOW

METHOD AND APPARATUS FOR ILLUMINATING PROJECTING FEATURES ON THE SURFACE OF A SEMICONDUCTOR WAFER

The present invention relates to a method and apparatus for illuminating projecting features on the surface of a semiconductor wafer such as from light reflective bumps formed on the surface of the wafer. Depending on the manufacturing process, these bumps may, for example, be reflowed solder-tin-lead bumps, electroplated gold bumps or bumps of other materials which are used for making electrical contact to circuits included in a die containing the bumps.

BACKGROUND

According to at least one industry report, more than 2.3 billion flip chips will be produced annually by the year 2002 and, of these, sixteen percent will be processors or complex application specific integrated circuits with more than 400 bumped input/output connections per circuit. Microprocessors in production today have thousands of vapor-deposited applied or electroplated bumps, resulting in some cases in more than one-half million bumps per wafer. As bump pitch decreases and complex devices are produced on, for example, 300-mm diameter wafers, the total number of bumps per wafer is expected to exceed one million. By the bumping stage, such expensive wafer products will have acquired nearly their entire value, and their worth will depend upon how strictly the bumping process can be monitored and controlled.

Defective bumps typically must be identified before wafer probing. Bumps that are too large, small or missing altogether can pass through probing without incident and lead to device failures. Such failures waste the time spent testing the defective die and packaging expense. There is also always the chance that an integrated circuit with a bad bump that could have been discovered at the wafer stage will work through a final test and still fail in a customer system. Thus, wafer probing is not an entirely reliable screen for determining the existence of significant bump defects. Also, certain types of bump defects can ruin probe cards, which are typically very expensive, if such bumps are not detected before probing. For example, malformed bumps can bridge power and ground contacts, as can extraneous bump material, causing excessive current drop through a probe card. This also raises the possibility of damaging neighboring die if imperfect solder bumps in a die are probed at such high currents. Also, bumps that are too tall or irregular can bend probes. This can result in the costs associated with obtaining a new probe card, costs associated with tester downtime, and costs of labor required to replace the damaged card.

Manual inspection of wafers to identify defective bumps is a possibility. However, such an approach is tedious, slow, prone to error, and is therefore inefficient and undesirable for production volumes, especially where tightly packed bumps are included in complex circuit dies. Bumps inspection is desirable to, for example, determine the existence of missing bumps, bridged bumps, bumps which are too small, or large, bumps which are too tall or short, the presence of nodules extending from bumps, satellite or foreign material between the bumps, misplaced bumps, and contaminants on or between the bumps.

It has been discovered that, from the characteristics of rings of light reflected from bump surfaces, it is possible to evaluate the bumps to determine whether the bumps have desirable characteristics or are flawed.

The present invention relates to a method and apparatus for illuminating projecting features, such as bumps, on the surface of a semiconductor wafer so as to generate light patterns which may then be used to evaluate the features or bumps. The resulting reflected light patterns may be captured as pixel information and analyzed in any suitable way.

SUMMARY

In accordance with one aspect of an embodiment of the present invention, an apparatus is provided for directing light toward at least one light reflective feature such as a bump formed on a wafer surface of a semiconductor wafer. The apparatus comprises a light source support which may take any suitable form. At least one first light source is carried by the light source support and is operable to direct a first ring pattern of light toward the bump on the first wafer surface. At least one second light source may also be provided. The second light source may also be carried by the light source support and is operable to direct a second ring pattern of light toward the bump. These ring patterns of light are then reflected directly from the bump. Alternatively, plural ring patterns of light may be reflected from the bump with at least one such pattern resulting from the direct incidence of light on the bump from a light source and a second such ring pattern resulting from the indirect reflection of light from the light source off the wafer surface.

In accordance with another aspect of an embodiment, the intensity of light from the first light source may be adjustable and the intensity of light from the second light source may also be adjustable. These light intensities are desirably independently adjustable.

As yet another aspect of an embodiment, the first wafer surface is positioned in a first wafer plane. In addition, the first light source directs a ring pattern of light toward the bump at a first angle of incidence relative to the first wafer plane. This first angle of incidence desirably is between about eighteen degrees and twenty-two degrees with twenty degrees being a specifically desirable example. Also, the second light source directs a ring pattern of light toward the bump at a second angle of incidence relative to the first wafer plane with the second angle of incidence being different from the first angle of incidence. Desirably, the second angle of incidence is between about fifty-eight degrees and about sixty-two degrees with sixty degrees being a specifically desirable example.

As another aspect of an embodiment, at least a third light source for directing a ring pattern of light toward the bump may be provided. The third light source may direct a ring pattern of light toward the bump at a third angle of incidence relative to the plane of the first wafer surface. The third angle of incidence is different from the first and second angles of incidence. Desirably, the third angle of incidence is between about forty-three degrees and about forty-seven degrees with forty-five degrees being a specifically desirable example.

Thus, the third light source is intermediate to the first and second light sources in that the angle of incidence of light from the third light source is between the angle of incidences of the first and second light sources in this specific embodiment.

Light from the three ring light sources may be selectively directed toward a bump. For example, the first and second ring light sources may simultaneously direct light toward the bump with the third ring light source being off under certain first wafer conditions. Alternatively, the third ring light source may be operable to direct light toward the bump with the first and second ring light sources not directing light toward the bump, thus being considered off, under certain second wafer conditions. The first wafer conditions may comprise a relatively low reflective wafer surface which reduces the indirect or ghost reflection of light from the third ring light source from the wafer surface toward the bump if the third ring light source were on. The first wafer conditions may also comprise relatively tightly packed bumps on the wafer surface, meaning that the bumps are close enough to one another that adjoining bumps interfere with the indirect reflection of light from the third ring light source from the wafer surface to the bump. In contrast, the second wafer conditions may comprise a relatively high reflective wafer surface and relatively distantly spaced adjoining bumps. Under such conditions, light from the third ring light source may directly reach and reflect from the bump to provide a first ring pattern of light on the bump and also be reflected from the wafer surface to the bump to provide a second ring light pattern on the bump without substantial blockage by nearby bumps. The patterns on the bump being ring-like when the bump is well formed with deviations of the patterns from ring-like configurations indicating potentially problem bumps.

As another aspect of an embodiment, the intensity of light from all three of the first, second and third light sources may be variable and also may be independently variable relative to the intensity of light from the other ring light sources.

The light support for the ring light sources may be generally frustoconical in overall configuration. Alternatively, the light support may take any suitable shape. The planarity of the light support is desirably adjustable such that planes containing the first, second and third ring light sources may be positioned parallel to the first wafer surface, which is typically planar. In addition, the light support may comprise a first annular light supporting section for carrying the first light source and a second annular light supporting section for carrying the second light source. The third light source may also be carried by the second annular light supporting section. The second annular light supporting section is typically positioned above the first annular light supporting section when the lights are in use. The first and second annular light supporting sections are desirably interconnected. Gaps or apertures may be provided between the interconnections from the first to second annular light supporting sections. The first light source may comprise a plurality of discrete lighting elements distributed about the first annular light supporting section. In addition, the second light source may comprise a plurality of discrete lighting elements distributed about the second annular light supporting section. The third light source may also comprise a plurality of discrete lighting elements and may be distributed about the second annular light supporting section below the lighting elements of the second light source.

As a further aspect of an embodiment, the first light source may comprise a first set of a plurality of first light emitting diodes arranged in a ring to emit light in a first light source plane. In addition, the second light source may comprise a second set of a plurality of second light emitting diodes arranged in a ring to emit light in a second light source plane. Desirably, the first wafer surface of the semiconductor wafer is planar and in a plane which is parallel to the first and second light source planes. This embodiment may also include a third light source comprising a third set of a plurality of third light emitting diodes arranged in a third light source plane which is parallel to the first and second light source planes. The intensity of light from the first and second sets of light emitting diodes may be independently adjustable. In addition, the intensity of light from the third set of light emitting may be independently adjustable. The light emitting diodes may emit red light. Alternatively, the light emitting diodes may emit other colors of light with the light emitting diodes of each set typically being of the same color, which may be different from the color of the light emitting diodes of the other sets. Alternatively, in one embodiment at least a majority and desirably all of the light emitting diodes of the various sets may emit red light. The light emitting diodes may be of a type having a narrow focus such as no greater than about fifteen degrees.

The light support may comprise at least a first set of bores arranged in a first ring pattern with the first ring of light sources, such as the first set of light emitting diodes, each being positioned within a respective bore of the first set of bores. The light support may also comprise at least a second set of bores arranged in a second ring pattern. The second ring of light sources, such as the second set of light emitting diodes, may each be positioned within a respective bore of the second set of bores. In addition, the light support may comprise a third set of bores arranged in a third ring pattern. The third ring of light sources may comprise a third set of light emitting diodes which are each positioned within a respective bore of the third set of bores. The light emitting diodes may be press fit or otherwise held within the associated bores.

As yet another aspect of an embodiment, the first and second sets of light emitting diodes, and for that matter the third set of light emitting diodes, may each comprise plural light segments having a base with plural light emitting diodes carried by the base. The intensity of light from each light segment may be adjustable independently of the intensity of the light from the other light segments. As a specific example, eight light emitting diodes may be included in each segment.

The present invention is also directed toward methods of directing light toward at least one reflective bump or feature on a semiconductor wafer surface to form patterns of light on the bump or feature. In addition, the present invention is directed toward novel and non-obvious combinations and sub-combinations of elements used for illuminating projecting features on the surface of a semiconductor wafer such as light reflective bumps. In addition, the invention is directed toward novel and non-obvious method acts and steps alone, as well as in combination with one another, relating to illuminating projecting features on the surface of a semiconductor wafer. Such novel and non-obvious elements, steps and acts being set forth in the claims below.

DETAILED DESCRIPTION

Figure 1:
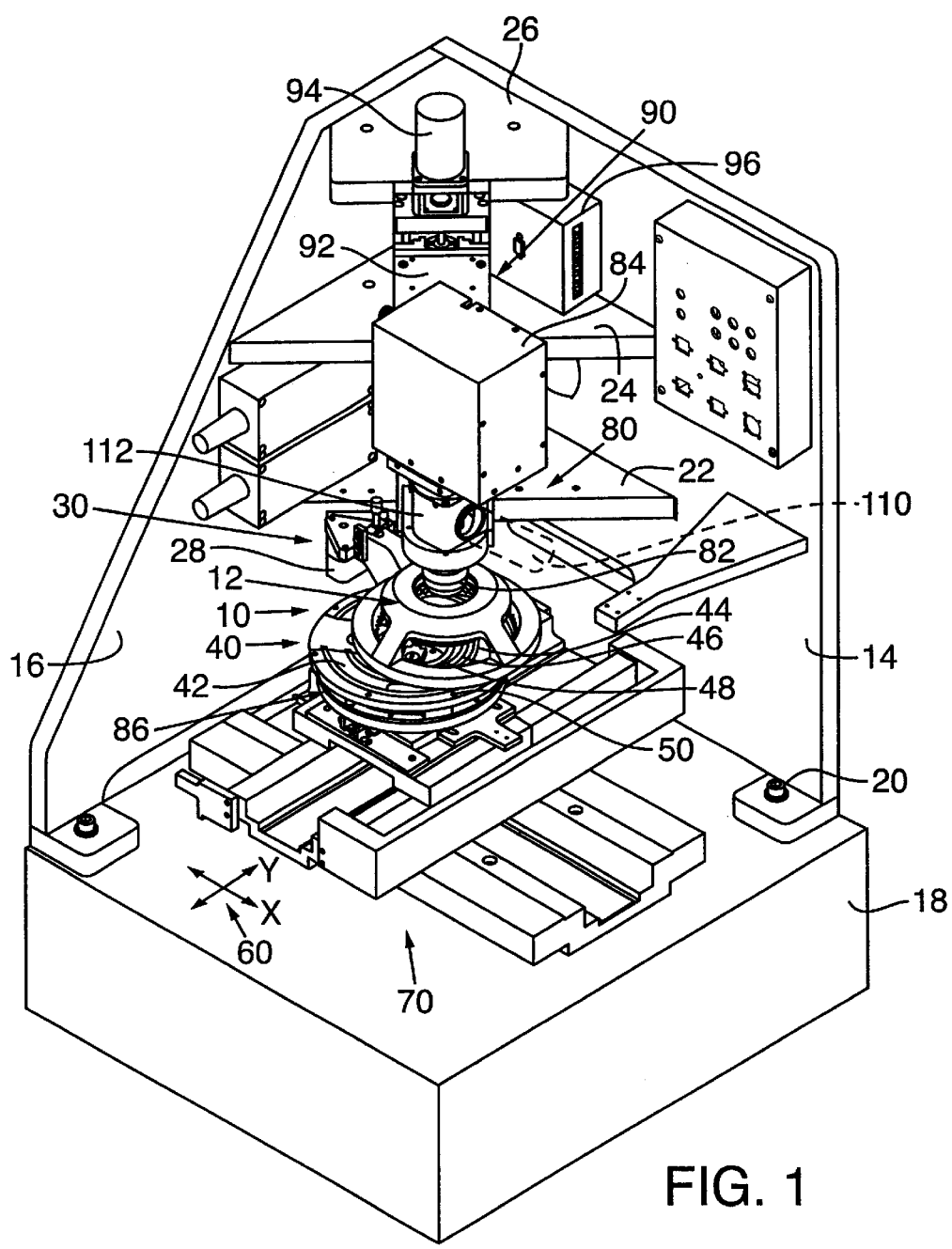
FIG. 1 is a perspective view of one embodiment of an apparatus for illuminating projecting features on the surface of a semiconductor wafer, such as input/output electrically conductive bumps formed thereon.

With reference to FIG. 1, one form of an illuminator 10 for directing light toward a surface of a semiconductor wafer is shown. The illuminator 10 includes a light support, one form of which is indicated at 12. As explained below, light support 12 carries at least one ring source of light and desirably a plurality of such ring light sources. The illuminator 10 is shown positioned within a housing having first and second upright walls 14, 16. The walls 14, 16 are rigidly mounted to a base 18, such as by bolts, one of which is indicated at 20. Gussets or cross-reinforcements indicated at 22, 24 and 26 extend along and join portions of the walls 14, 16 together to rigidify the wall structure. An illuminator support, such as a bracket or flange 28, is mounted to gusset 22. A coupling mechanism, one form which is indicated generally at 30, couples the illuminator support 12 to flange 28 and thus to the housing structure. As explained below, the illustrated form of coupling mechanism 30 accommodates the adjustment of the illuminator 10 upwardly and downwardly within limits and also facilitates the adjustment of the light support 12 relative to the plane of a wafer surface which is to be illuminated by light from light sources carried by the light support 12.

The apparatus shown in FIG. 1 also includes a wafer support, such as a chuck indicated generally at 40 on which a wafer to be examined is positioned, such as by an automatically operated wafer handling and positioning robot (not shown in FIG. 1). The chuck assembly 40 may accommodate wafers of various sizes, such as four-inch to twelve-inch diameter wafers. The upper surface 42 of the chuck is provided with a plurality of generally concentric grooves 44, 46 and 48. When a wafer is in position on the upper surface 42, a vacuum is drawn in one or more of the grooves 44, 46, 48 which happen to be overlaid by the wafer when in position. As a result, the wafer is held in place. Stop pins, one of which is indicated by the number 50, are distributed about the peripheral edge of the chuck and extend upwardly from surface 42. The pins 50 prevent a supported wafer from slipping off of the chuck in the unlikely event that the vacuum fails while the chuck is being moved in x and y directions. The x and y directions of chuck motion is indicated by coordinate system 60.

Wafers are typically expensive, brittle, and increasingly thin with newer electronic packaging technologies. Therefore, a wafer support such as a chuck must hold the wafer securely without damaging it. The use of a vacuum is one convenient approach for holding a wafer on a chuck surface. Typically, all chuck surfaces which contact the wafer (e.g., the portions which contact the underside of the wafer being supported on surface 42), are lapped smooth and flat. In the apparatus illustrated in FIG. 1, the illuminator 10 is held at a fixed location while the chuck is moved to position successive portions of the wafer being illuminated in position for illumination by the illuminator 10.

The most desirable image capture from reflected light is obtained when scanning motion is precise. Thus, it is desirable for travel of the chuck to be along straight lines, e.g., in x and y directions, which are orthogonal to an image sensor such as a sensing portion of a camera. Also, it is desirable that travel velocity remains very stable while images are being captured. In the apparatus shown in FIG. 1, the chuck 40 is mounted to an x-y table support mechanism 70 which moves the chuck in the respective x and y directions. Although other chuck movement devices may be used, an x-y table is a reliable, accurate approach. More specifically, the x-y table 70 may be an air-bearing stage driven by linear motors to move the stage and thereby the chuck in respective x and y directions. Full servomotors may be used with three-phase feedback loops to increase the accuracy of the motion. Damped isolators may be used to mount the air-bearing stage to the base 18 to dissipate resonant energy from scanning. Passive isolators, such as elastomeric isolators, a specific example being available under the brand name Newdamp™ from Newport Corporation, may be used to dissipate resonant energy away from the scanning components and into the supporting housing.

Desirable image capture of reflected light occurs when the bumps on the wafer surface are in focus the entire time. Consequently, as the wafer chuck is moved to position respective bumps for illumination and image capture, by maintaining the surface of the wafer chuck parallel to the x, y plane in which the chuck travels, improved focus is achieved. Typically, an image capturing apparatus views an image in a direction which is orthogonal to both the wafer supporting surface of the chuck and the x-y plane in which the chuck is moved. In FIG. 1, an exemplary form of image capturing apparatus is indicated generally at 80. This image capturing apparatus includes a microscope 82 and an image-capturing camera 84. To achieve the desired orthogonality of the surface 42 relative to the camera view axis, the chuck 40 may include a chuck mount assembly 86 that allows for leveling or planarity adjustment of the plane containing surface 42 while remaining rigid in the x-y directions. A leaf spring biased cam mechanism may be employed that permits rotational motion of the portion of chuck 40 containing surface 42 relative to a lower portion of the chuck to thereby adjust the planarity. A three-point support is provided for this upper portion of the chuck to provide stable support. Other forms of wafer supporting mechanisms may be used. The chuck assembly 40 and stage 70 as described above is available as a part of a wafer inspection apparatus being distributed by Electroglas, Inc. of Corvallis, Oreg., under the brand name Quick Silver®.

The image capturing assembly 80 shown in FIG. 1 is carried by a support assembly which allows movement of the assembly 80 in the z direction (orthogonal to the surface 42) to assist in focusing the camera. An exemplary structure for accomplishing this mounting is indicated at 90 and may be conveniently referred to as a focus stage. Structure 90 includes a support 92 which in the illustrated form is a somewhat plate-like structure having an outer surface to which the assembly 80 is rigidly secured. Plate or support structure 92 is moveable in the z direction but resists any motion in x and y directions. The focus stage is sufficiently rigid to resist deflection as the focus stage moves. Linear or air-bearings may be used to couple structure 92 to the housing while allowing for motion of the image capture components 80 in the z direction. A computer-controlled motor 94 may be used to adjust the positioning of assembly 80 in the z direction. One suitable motor is an off-the-shelf "smart motor" No. SM2310SQ-VRE Ver. 4.21 from Animatics, Inc.

During initial setup, with the illuminator on, plural images may be captured with the assembly 80 being moved in the z direction until a well-focused image is captured. The positioning of the assembly 80 then typically remains at a constant location while an entire wafer is evaluated.

The image capture device 84 may be of any suitable form such as a line camera or area camera. One specific example of a suitable image capture device is a time-delay and integration camera, such as a Model CT-F6-2048-STDM camera from Dalsa, Inc. This specific camera has a field of view which is 96 pixels tall by 2048 pixels wide. To increase data readout speed, the width of the field of view is divided into eight taps which each have a width of 256 pixels. As image data is read out from this camera, noise tends to be cancelled. The image data may be captured by a frame grabber, for example, and normalized prior to image processing. Because of the way image data is obtained from this particular camera, the first pixel in each tap may contain erroneous data or dead pixels. An optional method of minimizing the impact of such dead pixels on captured pixel data is described below.

The microscope 82 typically focuses the camera on the theoretical center of well-formed bumps. However, the position of the microscope is typically adjusted until well-focused ring patterns of light from well-formed bumps are captured and thus the focus may not necessarily be on the center of a respective bump. Although variable, in one specific approach, the pixel resolution employed in the apparatus of FIG. 1 is about 7.1 microns.

Power supply circuitry, a frame grabber, dead pixel and image digital signal processing circuitry may be mounted to circuit boards directly plugged into slots on the camera 84 to eliminate ribbon cable from the camera to a host computer. In such a case, a fiber optic cable may be used to connect the camera and associated elements to a host computer.

In the embodiment of FIG. 1, a light intensity controller 96 is shown and may be included to adjust the intensity of light from light sources carried by the illuminator 10 such as is explained below. In addition, the assembly 80 may include a confocal light source 110, such as a light emitting diode or a laser, which is selectively operated to deliver light, e.g., via a beam splitter 112, toward the wafer surface in a direction which is, for example, co-axial with the camera focus axis. Light source 110 may be controlled by light controller 96 and again may be selectively operated. In a typical application, light from source 110 is directed toward the wafer surface for use during alignment of the wafer about the z-axis and relative to the x-y scanning directions. Light source 110 may also be used in applications such as in locating fiducials or other alignment marks on dies formed on the wafer surface relative to bump patterns on the dies.

In addition, the chuck is typically mounted for rotation through angles θ and about the z-axis, with the surface 42 maintained in the desired orthogonal relationship to the camera axis during such rotation. These rotational adjustments facilitate the alignment of reference marks on the wafer surface (e.g., fiducials or other alignment marks on dies formed on the wafer surface) relative to the x-y scanning coordinates. A servomotor with a feedback loop may be used to rotate the chuck for alignment purpose (not shown in FIG. 1 but indicated as being included in the bearing stage 70 of FIG. 2).

Figure 2:
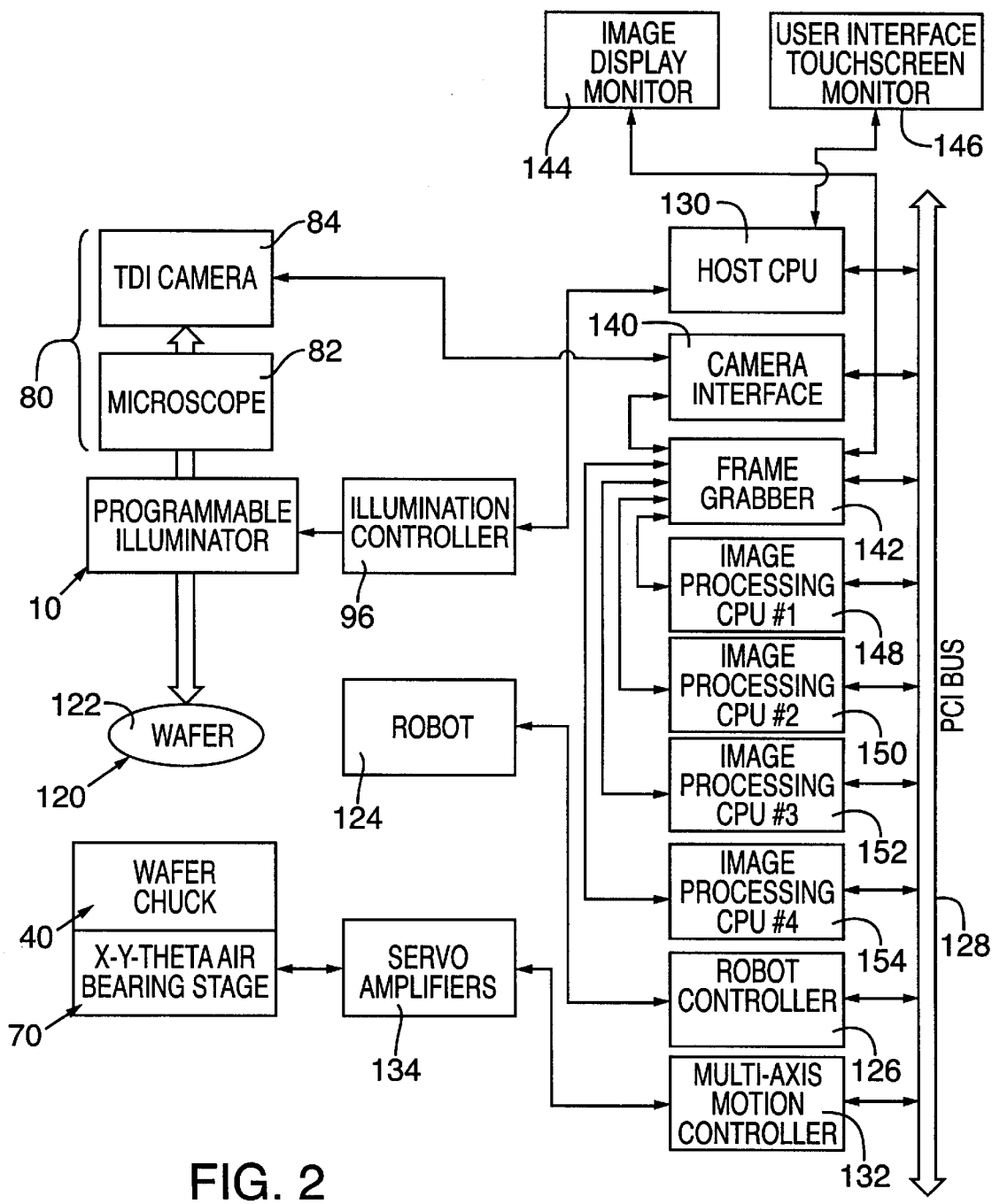
FIG. 2 is a block diagram of a system in which the illuminating apparatus may be included.

FIG. 2 illustrates an overall block diagram suitable for use in connection with the apparatus of FIG. 1. In FIG. 2, a wafer 120 having a surface 122 containing projecting features thereon, such as bumps, is shown. The wafer may be positioned on the upper surface 42 (FIG. 1) of wafer chuck 40 (FIG. 2) by a robot such as indicated at 124 in FIG. 2. Robot 124 is controlled by a robot controller 126 which receives commands via a bus 128 from a host computer 130. Exemplary robots are commercially available, such as of the type included in a wafer inspection apparatus available from Electroglas, Inc. under the brand name Quick-Silver®.

FIG. 2 also illustrates the control of the x and y motion of the bearing stage 70 and of the alignment adjustment θ via host computer 130, the bus 128, a motion controller 132 and servo-amplifiers 134. Light reflected from the surface 122 of wafer 120 (e.g., from light sources carried by illuminator 10) and/or the co-axial light source 110, or other light sources (not shown), and which passes through the microscope 82 may be captured by the time delay and integration camera 84. The captured data is transferred to a camera interface 140 where, for example, processing may be performed to, for example, minimize the impact of dead pixels in the captured data. The data is transferred from camera interface to a frame grabber, such as a Coreco F64 frame grabber. Data is typically obtained by the frame grabber on a die-by-die or chunk-by-chunk basis (e.g., a die can be of a variable size with 2 mm×3 mm to 6 mm×11 mm being specific examples). The image data at the frame grabber 142 in the form of data pixels may be delivered to an image display monitor 144 where the image may be displayed. For example, at display monitor 144, a plurality of bumps may be displayed with ring patterns of light thereon captured as a result of illumination of the bumps by light from the illuminator 10. These ring patterns of light contain information which is usable in evaluating the characteristics of the bumps. These bumps may be visually evaluated or evaluated as a result of image processing.

A user interface touch screen monitor 146 may be coupled to the host CPU 130 to, for example, provide intensity control commands via the host computer to the illumination controller 96. The user may input intensity control signals (e.g., by changing a slide bar on the screen, not shown) to cause an increase and/or decrease in the intensity of light from light sources in the illuminator 10. As a result, the image on the display monitor may be changed to provide a desired contrast between ring patterns of light on the displayed bumps. Other control commands may also be inputted via touch screen monitor 146. Alternatively, other data input devices may be used, such as keyboards, etc. Data from the frame grabber in this embodiment is delivered to one of four digital image processors indicated at 148–154 in FIG. 2. During processing, an appropriate one of the digital signal processors 148, 150, 152 and 154 which is idle and waiting for the data from the frame grabber receives the image data. The frame grabber outputs data on a first-in first-out basis. The characteristics of the bumps generated as a result of the image processing, as well as defects therein, are delivered from image processors 148, 150, 152 and 154 via bus 128 to the host computer with the image data typically being discarded (although it may be stored) following processing. A master digital signal processor (not shown) may control the routing of data from the frame grabber to the appropriate processor 148, 150, 152 or 154.

Figure 3:
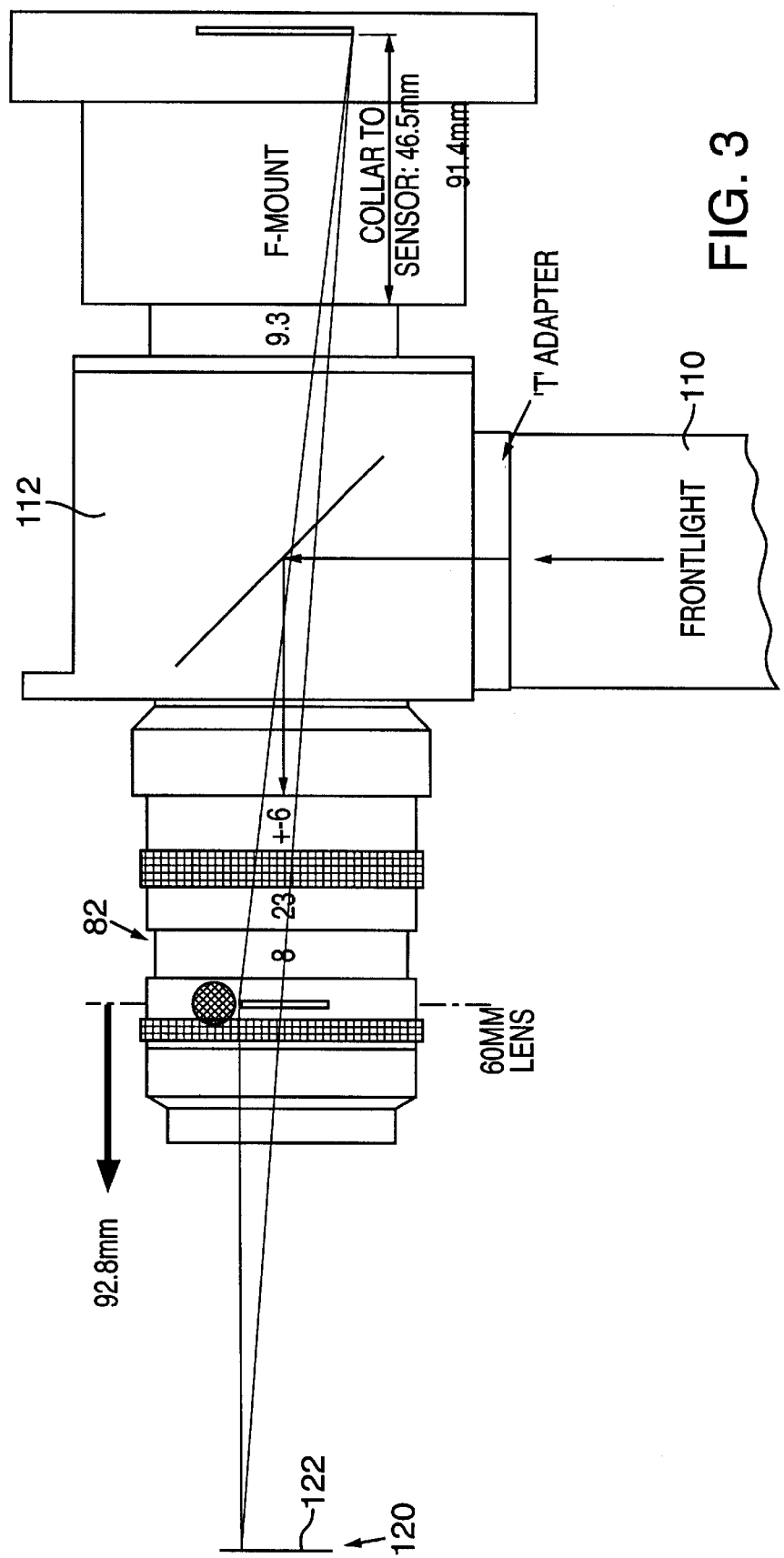
FIG. 3 is a side view of an optic stack which may be used to capture light from the wafer surface, such as light reflected from bumps formed on the wafer surface which have been illuminated in accordance with the present invention.

FIG. 3 illustrates an exemplary optic stack used for focusing the camera 84 (FIGS. 1 and 2) on the surface 122 of wafer 120 and more specifically on the bumps formed on the surface. The optic stack shown in FIG. 3 is utilized to provide an exemplary resolution of 7.1 microns per pixel. The beam splitter 112 is schematically illustrated in FIG. 3.

Figure 4:
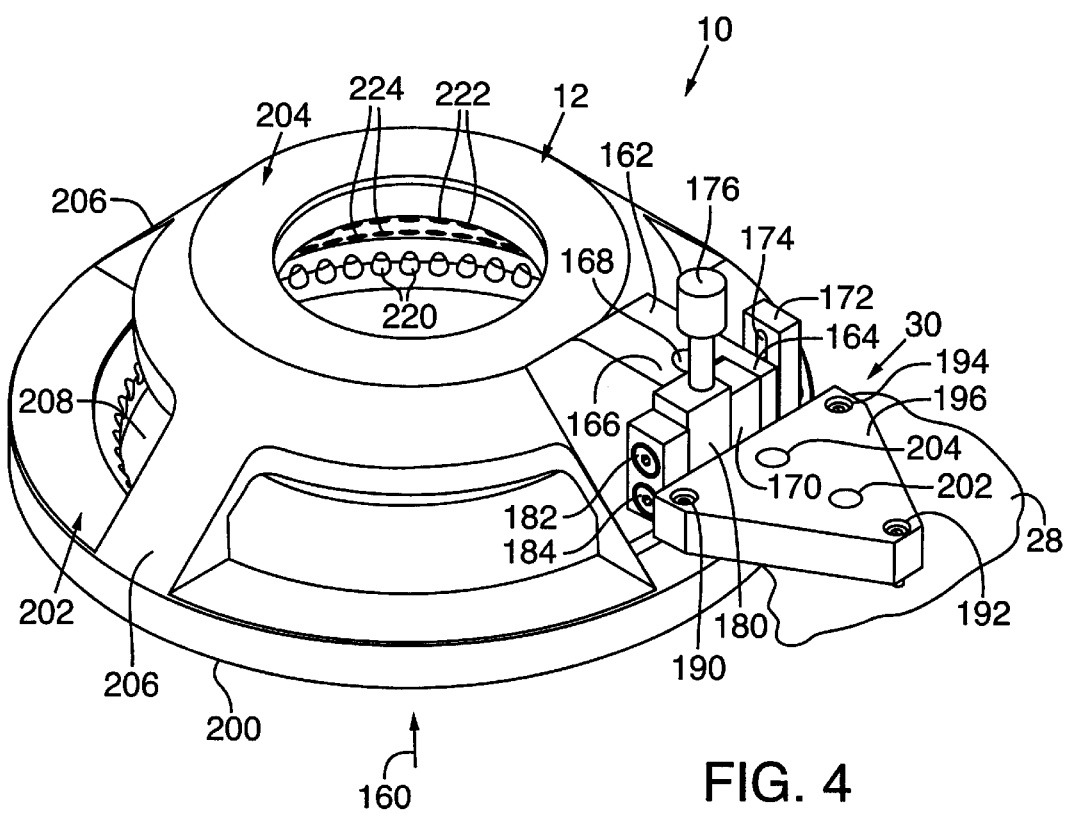
FIG. 4 is a perspective view of one form of a light support for supporting a plurality of discrete light sources, such as light emitting diodes, usable in one embodiment of the apparatus of FIG. 1.
Figure 5:
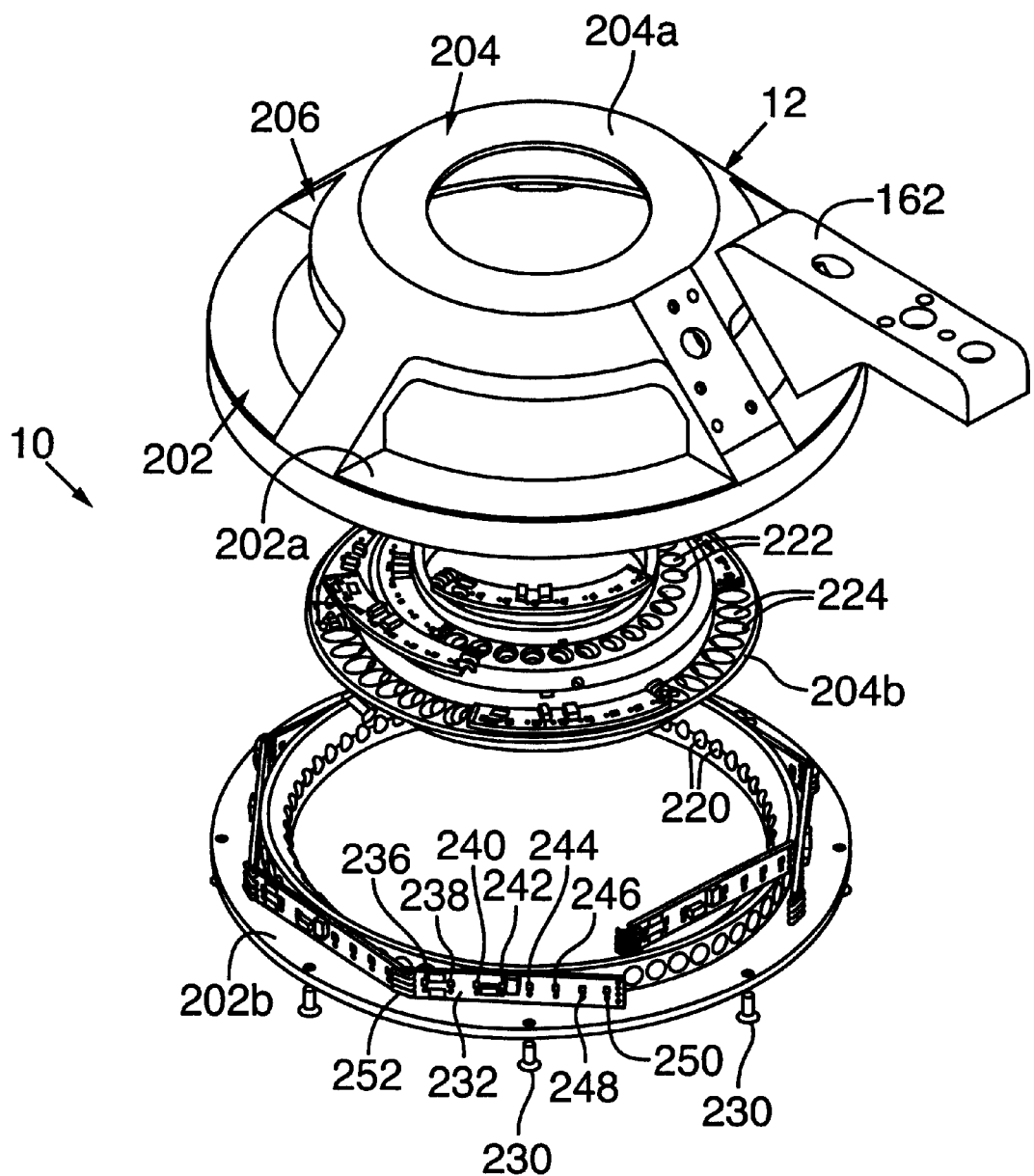
FIG. 5 is an exploded view of the light support of FIG. 4.
Figure 6:
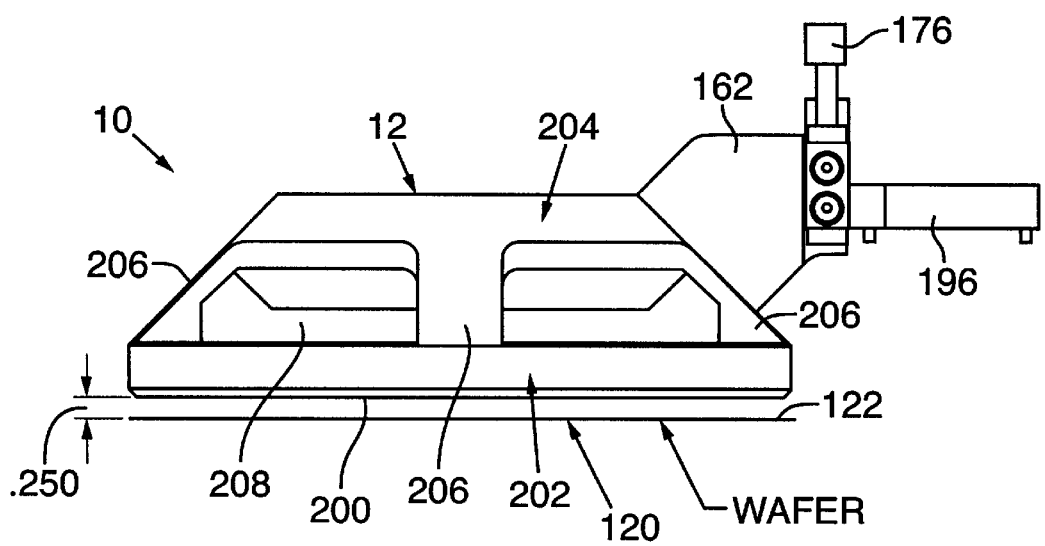
FIG. 6 is a side elevation view of the light support of FIG. 4 illustrating an exemplary positioning of the light support relative to a semiconductor wafer.

FIGS. 4–6 illustrate the exemplary illuminator 10, shown in FIG. 1, in greater detail. With reference to FIG. 4, the coupling mechanism 30 in the illustrated form permits raising and lowering of illuminator 10 in a z-axis direction as indicated by arrow 160 in FIG. 4. To accommodate this z-axis adjustment, the illustrated illuminator 12 includes a support arm 162 which is bifurcated to provide first and second legs 164, 166 with a slot 168 therebetween. A spacer bar 170 is inserted into slot 168. An upright support 172 having an upright fastener receiving slot 174 is also provided. The z-axis adjustment mechanism, which may include an adjustment screw 176, oriented in a z direction, is threaded into and extends through a block 180. With fasteners 182, 184 loosened, rotation of thread screw 176 in respective opposite directions raises and lowers the illuminator 10 in as much as screw 176 bears against the support structure 28. After the illuminator is in the desired z-axis location, fasteners 182, 184 are tightened to secure the illuminator at the selected elevation. Again, these fasteners extend through the slot 174. Adjustment of the planarity of the illuminator 12 relative to the surface of the wafer 122 and surface 42 of the chuck (FIG. 1) in this example, is accomplished utilizing a 3-point adjustment mechanism. More specifically, threaded screws 190, 192 and 194 bear against a surface of support 28 to provide a 3-point mount for the illuminator 12. By adjusting the relative extent to which screws 190, 192 and 194 project from the undersurface of an illuminator mounting flange 196, the planarity of the undersurface 200, and hence of the illuminator, is adjusted relative to the plane of the wafer surface. Lock down fasteners 202,204 may be used to secure the support structure 12 to support 28 after the planarity has been adjusted.

Referring again to FIGS. 4–6, and is best seen in FIGS. 4 and 6, the illustrated of light support 12 is generally frustoconical in overall shape. It should be understood that the illuminator may assume other shapes and is not limited to this particular construction. In FIG. 4, the light support 12 is shown with a lower annular section 202, an upper annular section 204 and a plurality of ribs, two of which are indicated at 206, which interconnect the upper and lower sections 204,206. In the form shown, the ribs 206 are located at spaced apart (e.g., 90-degree positions) about the circumference of the annular sections. Gaps, one being indicated at 208, are provided between the annular sections. These gaps allow heat to escape from lighting elements supported by the support 12. Although not necessary in the described construction, forced air or other cooling approaches may be used. The gaps may also be eliminated in the event adequate heat dissipation is achieved without the gaps. FIG. 6 illustrates the light support 12 and the illuminator 10 in position with the undersurface 200 of the illuminator 10 spaced one-quarter inch from the upper surface 122 of the wafer, as one exemplary operating position.

With reference to FIG. 4, the illuminator 10 includes at least one first light source carried by the light source support 12 for directing a first ring pattern of light toward a feature such as a bump on the first wafer surface 122 and at least one second light source carried by the light source support for directing a second ring pattern of light toward the feature or bump. In the illustrated embodiment, a third such light source is also provided. Although other forms of light sources may be used, in the illustrated embodiment, each light source comprises a set of discrete lighting elements with light emitting diodes being a specifically desirable example. Desirably the light emitting diodes have a narrow viewing angle to facilitate focusing of light from the diodes onto the field of view of the camera.

In the illustrated embodiment, a first set of bores (some of which are numbered 220 in FIG. 4) are carried by the lower annular section 202 and are distributed about the interior perimeter of section 202 with the bores being positioned generally in a common plane. A second set of bores 222 are distributed about the inner periphery of annular section 204 and generally in a second plane which is spaced from the first plane containing the bores 220. In the event a third light source is utilized, a third set of bores, some of which are indicated at 224 in FIG. 4, may be included and arranged generally in a third plane and distributed about the periphery of the annular section 204. First light emitting diodes of a respective first set of light emitting diodes are respectively positioned in the bores 220 with one of the first light emitting diodes in each bore. Similarly, second light emitting diodes from a second set of light emitting diodes, positioned one per bore, are typically positioned in the respective bores 222. In addition, third light emitting diodes from a third set of light emitting diodes are typically positioned in the bores 224 with one such third light emitting diode being positioned in each respective bore 224. Although variable, a typical side-to-side spacing between the bores is about one-quarter inch. The spacing between the light emitting diodes is desirably close enough such that light reflected from well-formed bumps appears as a continuous ring of light. The third set of bores are arranged in a plane intermediate the planes containing the first and second sets of bores. The longitudinal axes of the bores are directed toward a common focal point such that when light emitting diodes are positioned in each of the bores, the light emitting diodes are focused toward this focal point. In operation, the focal point desirably is positioned at the theoretical center of well-formed bumps on the wafer although this focal point may be varied and may end up at the upper surface of the wafer. Consequently, when light emitting diodes are positioned in the respective bores, and the light emitting diodes typically pressfit into the bores, the axes of the light emitting diodes are directed toward the focal point and light is directed in the proper direction.

The light supporting and other components of support 12 may be made of any suitable material. One exemplary material is Delrin plastic, which is heat conductive and is relatively easy to precisely machine.

An exploded view of illuminator 10 is shown in FIG. 5. As can be seen from this figure, the lower annular section 202 includes two components 202A, 202B which are held together, such as by fasteners, some of which are indicated at 230, when the illuminator 10 is assembled. In addition, annular section 204 includes portions 204A and 204B which are likewise held together when the construction is assembled by fasteners, not shown.

In the illustrated construction, each of the ring light sources is comprised of a plurality of segments with each segment being comprised of a plurality of light emitting diodes. In the specific form shown, eight light emitting diodes are included in each segment with the diodes being carried by a circuit board associated with the segment. For purposes of illustration, one of these circuit boards or bases is indicated at 232 in FIG. 5. In addition, the location of the light emitting diodes of this segment are indicated at 236–250 with the light emitting diodes of the segment projecting outwardly from the opposite side of base 232 from the side shown in FIG. 5. The diodes are mounted to project an appropriate distance from the base and in an orientation such that each of the diodes, when inserted into a respective one of the bores 220, extends into the associated bore the same distance as the other diodes of the segment and of the ring light extend into their respective associated bores. Consequently, light from the diodes is generally emitted in a common plane. Jumpers, such as indicated at 252 in FIG. 5, electrically interconnect the adjoining circuit boards together when the apparatus is assembled.

In the FIG. 5 construction, although variable, eight segments are included in the lowermost ring associated with the bores 220, six segments are associated with the bores 224, and four segments are associated with the bores 222. Again, in this example, there are eight light emitting diodes per segment.

One candlepower per light emitting diode is a typical example of light output. The intensity of the light from the diodes of each segment in the illustrated embodiment is independently variable or adjustment relative to the intensity of light from the other segments. Alternatively, the intensity of light from an entire ring of light emitting diodes may be varied together and relative to the intensity of light from the other rings of light emitting diodes.

The light emitting diodes may be of various colors. For example, each of the light emitting diodes of a particular ring of diodes may be of a given color which is different from the colors of the other rings. When the colors are combined at appropriate intensities, in one example, near-white light is produced. Alternatively, a majority of, substantially all, or all of the light emitting diodes of the ring lights may emit red light. Red light is particularly desirable for applications utilizing a time-delay and integration camera of a type which is most sensitive to red light. As previously mentioned, the light emitting diodes typically emit light at a narrow viewing angle to concentrate light output on the camera field of view. As a specific example, Agilent Technologies HLMP-ED16-TW000 light emitting diodes having a viewing angle of no more than about fifteen degrees may be used. The circuitry for controlling the intensity of light from the light emitting diodes in the most desirable case where the intensity of light is adjustable is described below.

Figure 7:
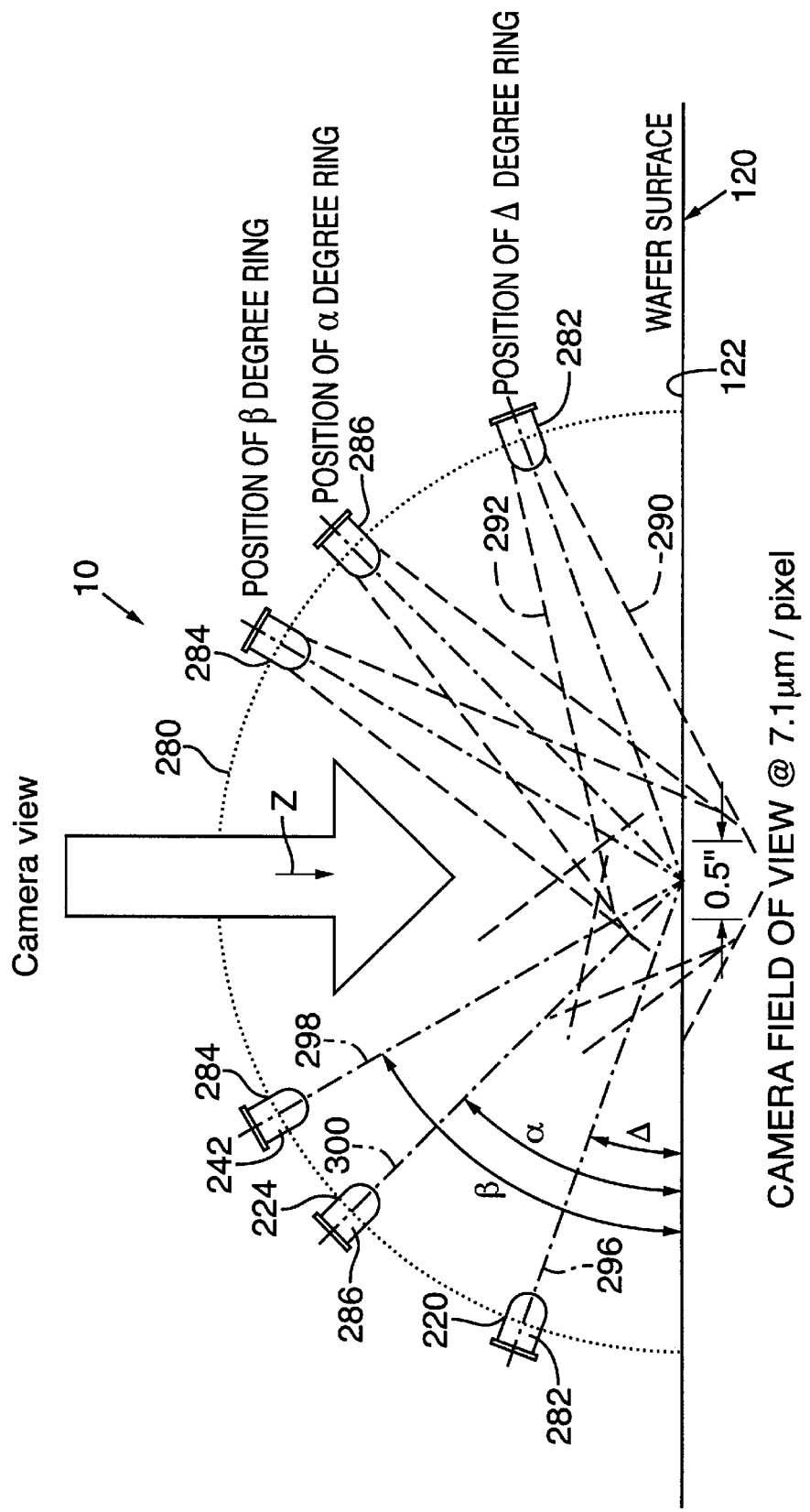
FIG. 7 is a side view schematically illustrating ring/wafer geometries for a three-ringed light source illuminator embodiment comprised of a plurality of light emitting diodes in each light source ring.

With reference to FIG. 7, an arrangement of light sources for an illuminator 10 of the type having three rings of light emitting diodes is illustrated. Desirably, all of the light sources are positioned equidistant from the center of the camera field of view at the wafer surface 122 for equal light intensity contribution from each light source at equal power input. This is illustrated by showing the light emitting diodes on a semi-circle 280 having a center at the center of the camera field of view. In this figure, the camera field of view is indicated as about 0.5 inches at a 7.1 micron per pixel resolution. Two diodes 282 of the first ring source (positioned in respective bores 220) are shown in FIG. 7. In addition, two diodes 284 of the second ring light source (inserted into bores 222) are also shown in FIG. 7. Also, two light emitting diodes 286 from a third ring light source are shown (inserted into the respective bores 224). The field of view of light emitted from diode 282 is indicated as the area between lines 290, 292 for the diode 282 at the right side of FIG. 7. Similarly, the field of view of light from the diodes 284 and 286 are also indicated for the right hand examples of these diodes in FIG. 7. The axis along which light from diode 282 is directed toward the wafer surface is indicated by line 296 in FIG. 7. In addition, the axis along which light from diode 284 is directed toward the wafer surface is indicated by line 298 and the axis along which light is directed toward the wafer surface from light 286 is indicated by line 300.

The angle of incidence of light from these light sources relative to the plane containing the wafer surface 122 is indicated respectively by the angles $\Delta$, $\beta$ and $\alpha$. These angles may be varied. However, desirably the angle $\Delta$ is between eighteen degrees and twenty-two degrees; the angle $\beta$ is between fifty-eight degrees and sixty-two degrees; and the angle $\alpha$ is between forty-three degrees and forty-seven degrees. More desirably, the angle $\Delta$ is twenty degrees; the angle $\beta$ is sixty degrees; and the angle $\alpha$ is forty-five degrees.

The ring lights formed by the respective sets of light emitting diodes may be used individually or in various combinations with one another to illuminate the wafer surface. A particularly desirable approach is to use either the first and second ring lights together or the third ring light without light being directed from the first and second ring lights toward the wafer surface. Typically, the lights from the first and second ring lights (e.g., the twenty and sixty degree ring light sources) are used in applications where the wafer surface is of a relatively low reflectivity such that reflection of light from the wafer surface and onto the bump does not provide an adequately distinctive reflected ring light pattern on a well-formed bump. As another condition, if the bumps are relatively close to one another such that adjoining bumps interfere with the reflection of light from the wafer surface onto the bump, then the first and second ring lights are typically used. In addition, in this exemplary application, the camera is capturing the direct reflections of light from these ring light sources from the surface of the bump as opposed to indirect reflections from the light sources and off the wafer surface onto the bump and then to the camera. In contrast, in applications where the wafer surface is of a relatively high reflectivity, e.g., a relatively mirrored surface, with the reflectivity of the wafer surface depending upon wafer processing techniques employed by the manufacturer of the wafer, light from a single ring light source may be used to generate two ring patterns of light on the bump. The first ring pattern of light is generated by the direct incident of light on the bump and reflection to the camera. The second ring pattern is generated by a ghost or indirect reflection from the bump in that the light reflects from the wafer surface onto the bump and to the camera. In this latter application, although one of the other light ring sources may be used alone, more desirably the third set of lights, at the angle of incidence of a (e.g., forty-five degrees), is used. This also assumes wafer processing conditions where the bumps are not positioned so close to one another that adjoining bumps significantly interfere with the reflection of light from the wafer surface and onto the bump being evaluated.

It is estimated that about ninety percent of the applications are best evaluated using the first and second ring light sources without the third ring light source.

Figure 8:
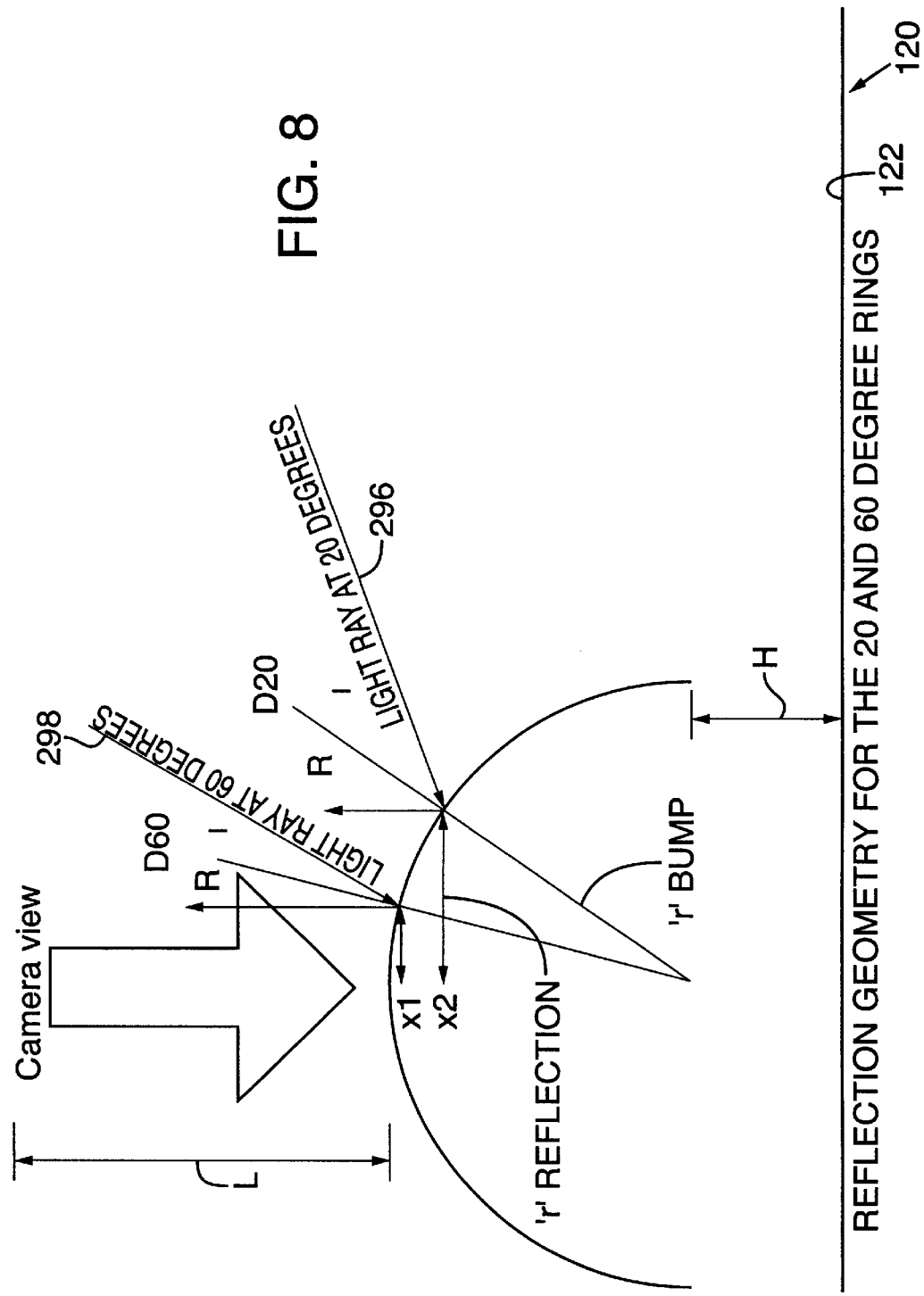
FIG. 8 schematically illustrates the reflection geometry for light directly reflected from the surface of a well-formed bump by light sources created to provide incident light at twenty degrees and sixty degrees relative to the wafer surface.
Figure 9:
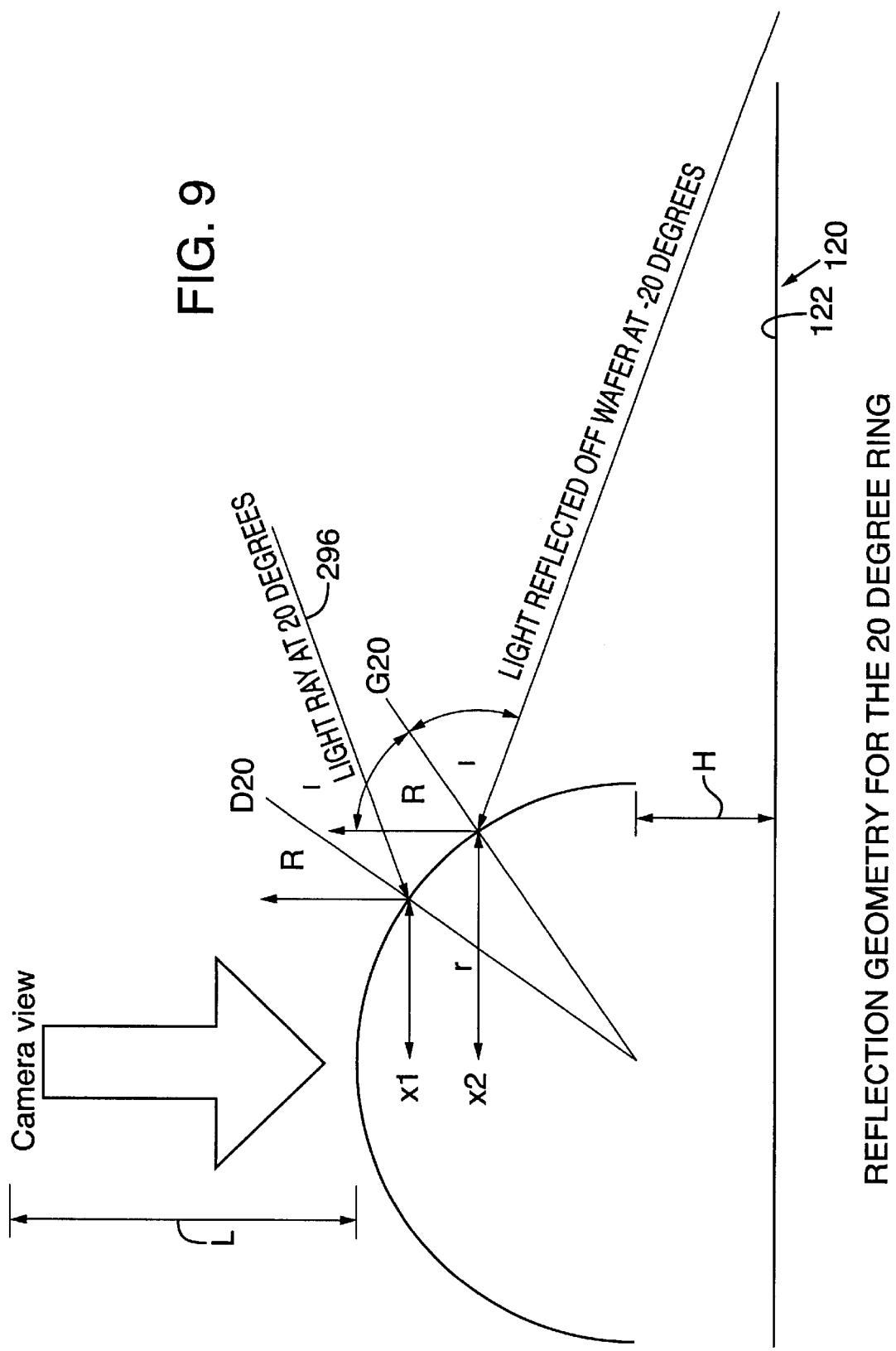
FIG. 9 illustrates the reflection geometry for a light source directed at an angle of twenty degrees relative to the wafer surface and showing direct and ghost reflected light, the ghost reflected light referring to light which has bounced off the wafer surface prior to being reflected from the bump to a camera or other image capturing apparatus.
Figure 10:
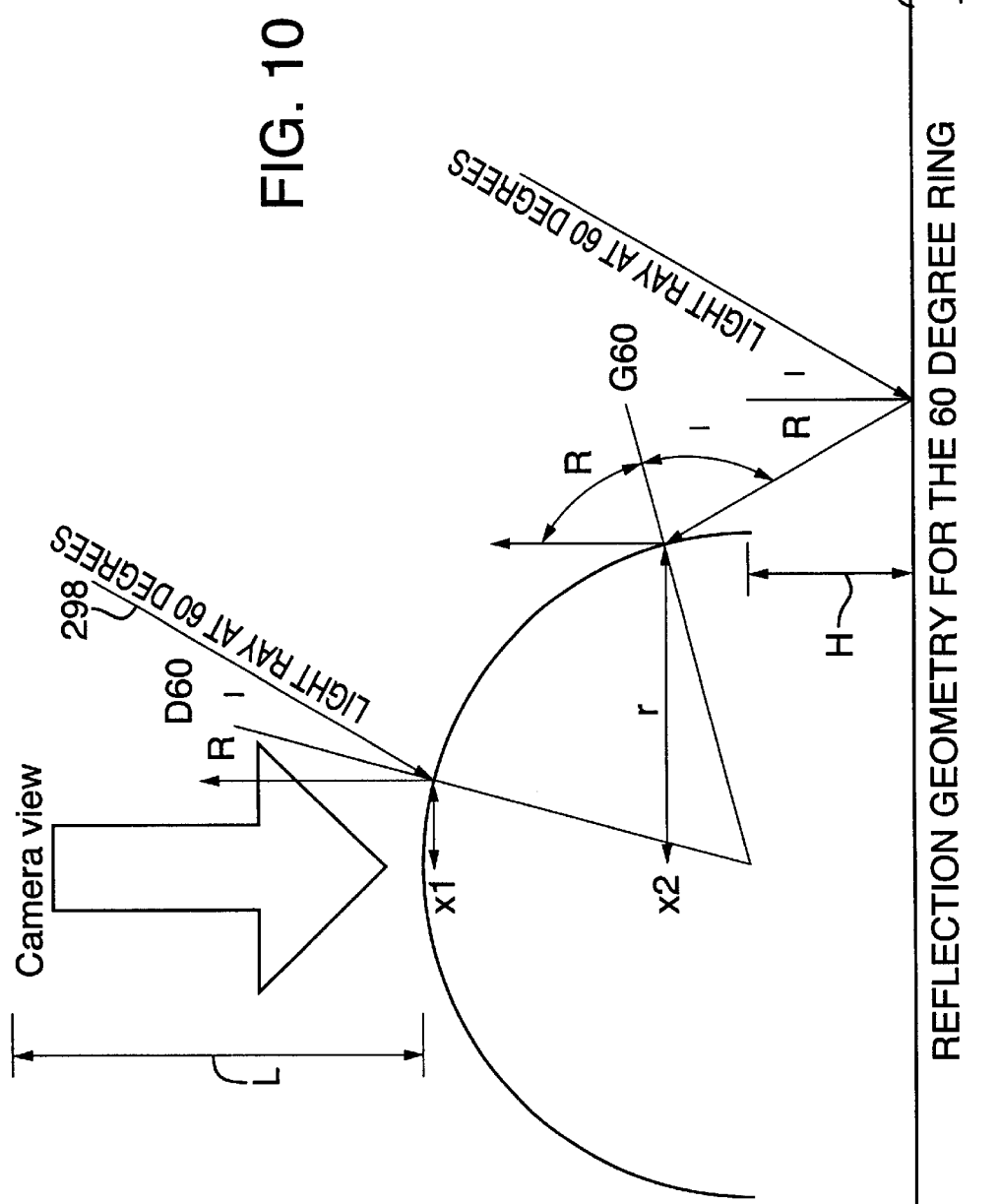
FIG. 10 illustrates the reflection geometry for a sixty-degree incident ring source of light showing direct and ghost reflections.
Figure 11:
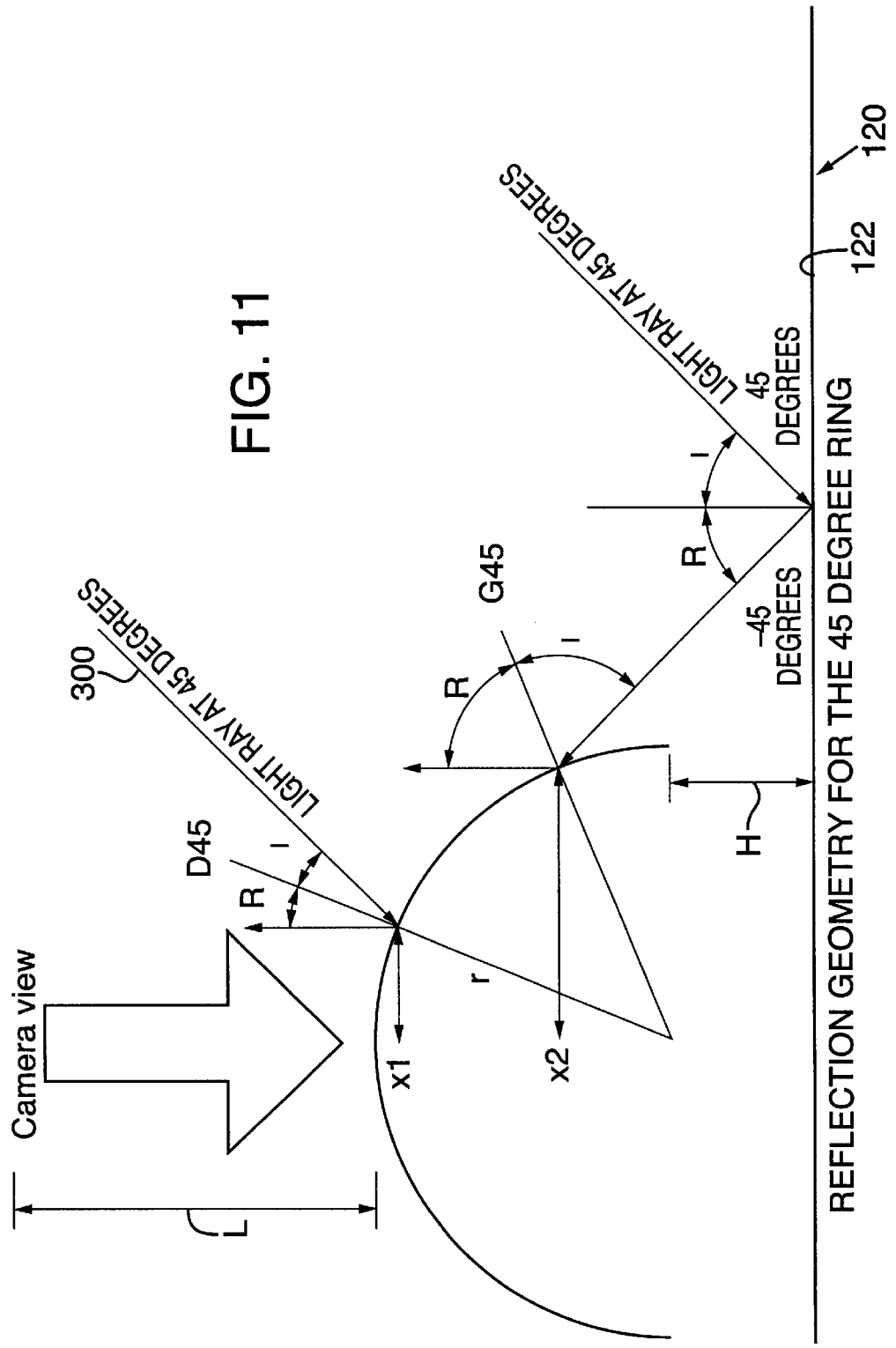
FIG. 11 illustrates the reflection geometry for light from a ring source oriented to direct light at an angle of incidence at forty-five degrees relative to the wafer surface.

The direct reflection geometry for ring light sources where $\Delta$ is twenty degrees and $\beta$ is sixty degrees is illustrated in FIG. 8. Other geometries are shown in FIGS. 9–11. Like elements in each of these geometries are assigned like designations and will not be discussed individually in connection with each of these figures.

Referring to FIG. 8, due to the relative sizes of the bumps and distances involved in this geometry, the camera (distance L) may be considered to be infinity. In addition, the portion of the wafer surface below elevation H, from the wafer surface to the theoretical center of the bump, is effectively invisible to the camera and does not affect the geometry of the reflected light rings. Moreover, given that the camera optical axis is perpendicular to the wafer surface 122 and making an assumption that the upper half of a bump is perfectly spherical, two generalized rules may be applied regarding reflections from this reflective bump. The first assumption is that the only rays of light to reach the camera's sensor will be perpendicular (ninety degrees) to the wafer surface. The second assumption is that the angle of reflection R is equal to angle of incidence I.

In the case of direct reflection D 20 from the twenty degree light source, R+I=90−20=70°. Therefore, R=I=35° and the point of reflection is 90−35 or 55 degrees off horizontal. In the case of direct reflection D60 from the sixty degree light source, R+I=90−60=30°. Therefore, R=I=15° and the point of reflection is 90−15=75° off horizontal. In the case of direct reflection D45 from the forty-five degree light source, R+I=90−45=45°. Therefore, R=I=22.5° and the point of reflection is 90−22.5=67.5° off horizontal.

In the case of indirect or ghost reflection G20 (see FIG. 9), R+I=90−(−20)=110°. Therefore, R=I=55° and the point of reflection is 90−55=35° off horizontal. In the case of ghost reflection G60 from a sixty degree ring light source, R+I=90−(−60)=150°. Therefore, R=I=75° and the point of reflection is 90−75=15° off horizontal. This is shown in FIG. 10. In the case of indirect or ghost reflection from the forty-five degree ring light source G45 (FIG. 11), R+I=90−(−45)=135°. Therefore, R=I=67.5° and the point of reflection is 90−67.5=22.5° off horizontal.

In all cases, the radius of the bump may be assumed to be the measured radius of the reflection of a ring divided by the cosine of the angle of the point of reflection. Thus, for the twenty degree light source, R=X1/cosine(55) or R=X2/cosine(35). In the case of a forty-five degree ring light source (FIG. 11), R=X1/cosine(67.5) or R=X2/cosine(22.5). In the case of a sixty degree ring light source (FIG. 10), R=X1/cosine(75) or R=X2/cosine(15).

In each of these cases, a two-ring pattern of light will be reflected from the bump surface. Because of the spacing between the rings and ease of distinguishing bump characteristics, the configuration of FIG. 8 using the first and second sets of lights (e.g., the twenty and sixty degree ring light source) and looking at the direct reflection of light from these sources is highly desirable. In those applications where appropriate conditions are met, the use of direct and ghost reflections from the forty-five degree ring light source (FIG. 11) is particularly desirable.

In lieu of the assumptions described above, empirically one can simply illuminate known well-formed bumps with the respective first and second sets of lights to evaluate whether a satisfactory light pattern is reflected back to the camera or use the forty-five degree ring light source. One can visually monitor the captured images on the image display monitor at 144 (FIG. 2) and then select which combination of light sources to use.

The level of the intensity of light from the illuminator 10 and in particular from the various ring light sources included in the illuminator are desirably adjustable. More specifically, the intensity of light delivered by each of the ring light sources is most desirably independently variable from the intensity of light delivered by the other ring light sources. Consequently, for example, in an application where only the first and second ring lights are used, and the direct reflection of light from these ring light sources is being monitored, the intensity of light from the respective ring lights may be adjusted to, for example, make the intensity of reflected rings from the bump surface approximate one another.

Figure 12:
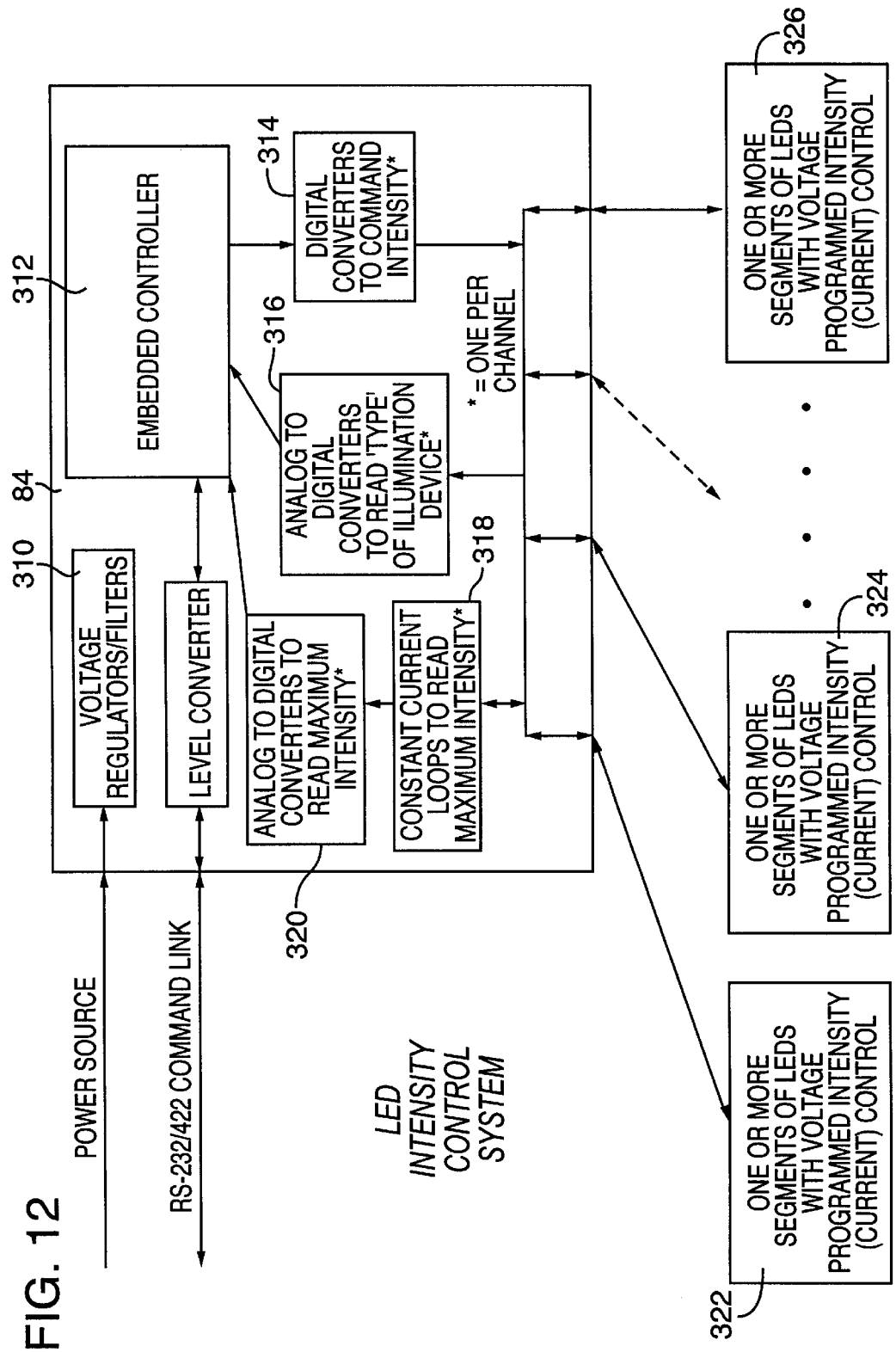
FIG. 12 illustrates a block diagram of one form of light intensity control system usable in the apparatus of FIG. 1 for controlling the intensity of light from light emitting diodes if used as light sources for the ring lights, the circuit of FIG. 12 also being usable to control other light emitting elements if utilized in the system, such as confocally directed light elements (such as a light emitting diode or laser directed along the camera view axis and normal to the plane of the wafer surface).

The block diagram of FIG. 12 illustrates one system for independently adjusting the intensity of light from the various ring light sources. It should be understood that light intensity adjustment can be accomplished in any suitable manner and is not limited to the approach shown in FIG. 12.

With reference to FIG. 12, input power, such as 24 volts DC, is delivered to voltage regulator circuits to provide 5 and 15 volt DC power in addition to the 24 volt DC power. National Semiconductor LM317T IC regulators may be used for this purpose. The voltage regulators and filters are indicated at 310 in FIG. 12. A level converter such as a Maxum MAX232A IC is used to convert the voltage levels from circuit 84 to suitable levels for delivery along the RS232/422 command link. The circuit 84 includes an embedded controller 312, such as a Micromint Domino 2 controller. This controller may operate in accordance with the flow diagram of FIG. 13 as described below. The controller 312 communicates with the host computer 130 (FIG. 2) via the RS-232/422 serial link and commands the illuminator light intensity on selected channels via digital-to-analog converters 314. In addition, the embedded controller may monitor the "type" of illumination device via an analog-to-digital converters 316 if implemented. For example, the "type" indication may indicate the sixty degree ring light source, the twenty degree ring light source, the forty-five degree ring light source, and/or the confocal light source 110 (FIG. 1). Consequently, if the host computer instructs the embedded controller to turn on a specific light source, the "type" designation provides information on the location of the light source or sources to be activated. Alternatively, the various light sources may be hardwired to particular channels so that the location of the light sources is known.

The embedded controller may optionally monitor the maximum light intensity (e.g., the total candlepower of light available from a particular ring light source). If lights of various colors are used, the maximum intensity may differ depending upon the color of the light source or the type of light source. By knowing the maximum intensity available from a ring light source, the embedded controller can specify given intensities for each light source to obtain a desired blend of light at the wafer surface being inspected. This is an optional feature. The digital converters 314 may be analog devices AD7228A, 8-channel, 8-bit digital-to-analog converters which convert a number (0–255) representing 0 to 100 percent of the maximum intensity into a voltage which is then output to a selected channel to control the light intensity from light emitting diodes driven by the channel. Each channel of the maximum intensity monitoring feature in one form includes a constant current supply which may be provided utilizing National Semiconductor LM317L IC regulators. Each of the light channels in the illustrated embodiment which includes light emitting diodes has a brightness loop consisting of a series of resistors, one per circuit board (e.g., see circuit board 232 in FIG. 5), each of which represents the maximum intensity contributed by the board. The sum of resistances times the current returns a voltage which can be read by an associated analog-to-digital converter (320) to read the maximum intensity available for that channel. Change in the available maximum intensity for the channel can provide an indication that a particular light emitting diode (or more than one) have failed. The constant current loops are indicated at 318 in FIG. 12. As an example, Analog Devices AD7828, 8-channel, 8-bit, analog-to-digital converters may be used for components 320. In determining the "type", the analog-to-digital converters 316 (typically one for each channel) may read a voltage supplied by a voltage divider plugged into that particular channel to represent the type of device (e.g., ring light, front light, back light, etc.).

Light emitting diodes and their associated channels are indicated for certain circuit board segments at 322, 324, and 326 in FIG. 12. Thus, one such segment would correspond to the segment 232 shown in FIG. 5 although not specifically designated in FIG. 12. Again, the segments may also include front lights, back lights and other lights which are to be controlled by the system of FIG. 12.

One approach for adjusting the intensity of the lights is to include a slide bar control displayed on the touch screen 146 (FIG. 2). The operator of the apparatus may touch the slide bar on the touch screen resulting in the embedded controller adjusting the intensity of a particular light source depending upon the direction of movement of the touch screen slider. This is one approach for controlling the digital converters 314 to thereby control the intensity of light from the various light sources. Other intensity control data input approaches may be used.

Figure 13:
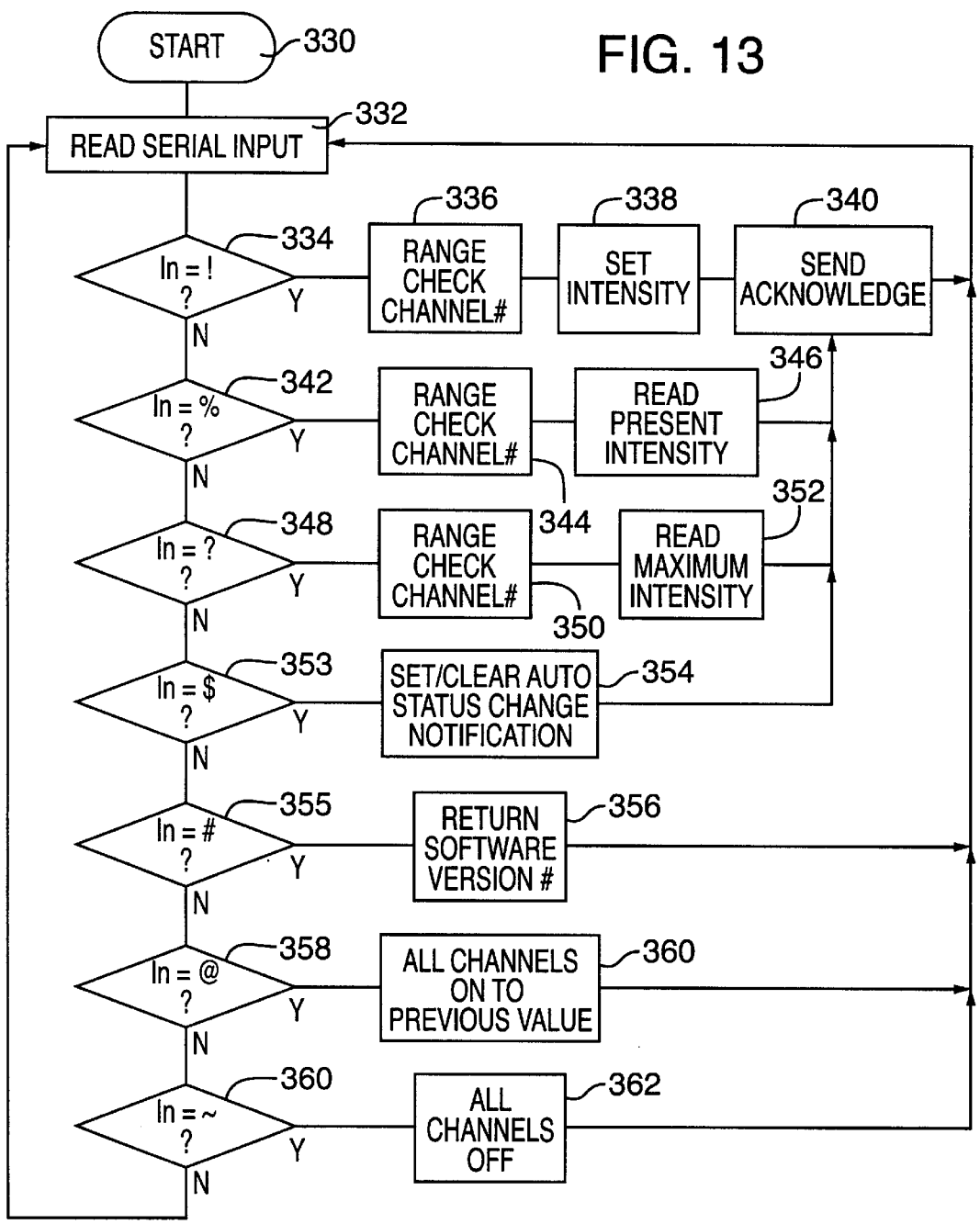
FIG. 13 illustrates a flow chart for the embedded controller component of FIG. 12.

A suitable flow chart for controlling the embedded controller of FIG. 12 is illustrated in FIG. 13. From start block 330, a block 332 is reached at which the host computer sends a command to the controller to read the analog-to-digital converters. The commands from the host computer are also monitored as indicated in this flow chart. An exclamation command "!" at block 334 corresponds to a set light intensity command for a particular channel. At block 336 the system verifies that the channel number for which the command applies is in an appropriate range of available channels. At block 338 the value, which was delivered as a serial input from the host computer (e.g., via the touch screen or otherwise), is determined and the intensity is set for that channel. At block 340 an acknowledgement is returned to the host computer to confirm that the process of this branch (in this case setting the intensity for a particular channel) has been accomplished.

The percent command "%" at block 342 results in a query of the present intensity of a channel. In this case, the host computer is simply checking on the status, for example, in the event the system has rebooted. The embedded controller will maintain these values and can return them to the host computer. Block 344 is like block 336. The present intensity of the light of the channel is then read at block 346 and communicated via block 340 to the host computer. If the input command is a "?" at block 353, this corresponds to a read maximum intensity command. Block 350 is like block 344. From block 350 a block 352 is reached and the maximum intensity for the channel is read (e.g., via block 318 and 320 in FIG. 12) and delivered via block 340 to the host computer. The "$" command at block 353 triggers a set/clear autostatus change notification at block 354 so as to, for example, provide notice to the host computer via block 340 in the event a light emitting diode has burned out in a particular segment or another light source has failed. The number command "#" at block 355 is used for diagnostics purposes and simply constitutes a query by the host computer as to what version of software is utilized in the controller. At block 356, the software version number is returned to the host computer. If an "@" command is provided from the host computer, at block 358, a block 360 is reached and all channels are reset to their previous value which existed prior to a "~" command. If the previous value for a channel was that it was off, it remains off. If the previous value for a channel was a particular level, the "@" command causes the channel to be reset to the previous level. The "@" command usually follows a "~" command. The "~" command at block 360 is processed by block 362 to turn all of the controlled channels (e.g., all of the light sources) off.

The approach set forth in FIGS. 12 and 13 allows the independent control of the light intensity from the various channels. More typically, all of the channels associated with a given ring light source are typically maintained at the same intensity. This intensity may differ from the intensity of light from the segments or channels for one or more of the other ring light sources.

Referring again to FIG. 2, downstream from the illuminator 10, the reflected light is converted into usable pixel image information for subsequent processing. Prior to processing, in the approach illustrated in FIG. 2, image information is provided as pixels which may be displayed on the image display monitor 144. Techniques may be employed to enhance the accuracy of the captured pixel data. In addition, techniques may be employed to locate reference fiducials or location/alignment marks on dies formed on the semiconductor wafers. Furthermore, steps may be taken to align a wafer relative to the x-y coordinate system used in scanning by the chuck 40 and bearing system 70. In addition, it can be desirable to know the extent to which a mask which has been used in laying down bumps on dies is offset from reference fiducials on the dies. Such offsets can arise from the bump mask being skewed relative to the reference fiducials, for example from in a top to bottom direction across the wafer.

FIGS. 14–19 illustrate examples of these pixel enhancement and alignment techniques which may be used, for example, prior to image processing.

Figure 14:
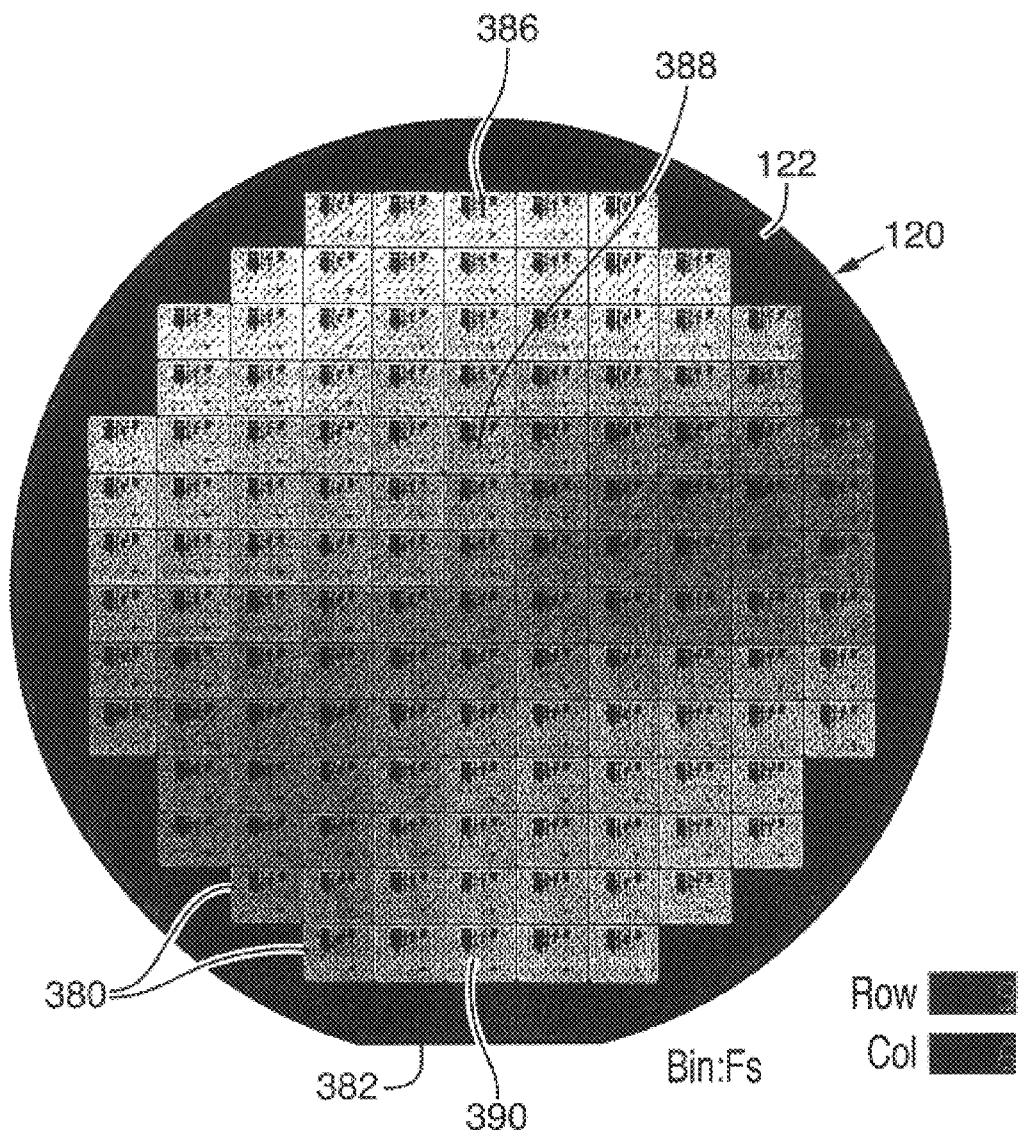
FIG. 14 illustrates an exemplary wafer having a plurality of dies formed thereon, the dies including a plurality of bumps or other surface features projecting outwardly from the wafer surface.

With reference to FIGS. 14–17, certain alignment techniques will next be described. FIG. 14 illustrates a wafer 120 having an upper surface 122 on which a plurality of rectangular dies have been formed, some of which are indicated at 380 in FIG. 14. As can be seen in FIG. 14, these dies are arranged in a number of columns and rows with the number of dies included on the wafer depending on factors such as the complexity and size of a circuit being designed. In the example shown in FIG. 14, there are eleven columns of dies and fourteen rows of dies. The illustrated wafer includes a flat 382 along one edge which indicates the orientation of the wafer.

For purposes of illustrating exemplary alignment techniques which may be employed, in one approach a die is selected along the top portion of the wafer, at an intermediate portion of the wafer, and at a bottom portion of the wafer. For example, the upper die which is selected may be the die 386 in the center column at row one. The die at the lower portion of the wafer may be in the center column and in the last row as indicated by 390. In addition, an intermediate die may be selected, such as about one-third to one-half of the way down this column. Die 388 is an example of an intermediate die and is also in the center column. Alternatively, alignment may be accomplished in the manner described below by selecting dies spaced along a given row of dies. Good results have been achieved by performing the alignment techniques along dies positioned in a column near the center of the wafer, although the alignment techniques are not limited to the application of these techniques along any specific column or row of dies.

Figure 15:
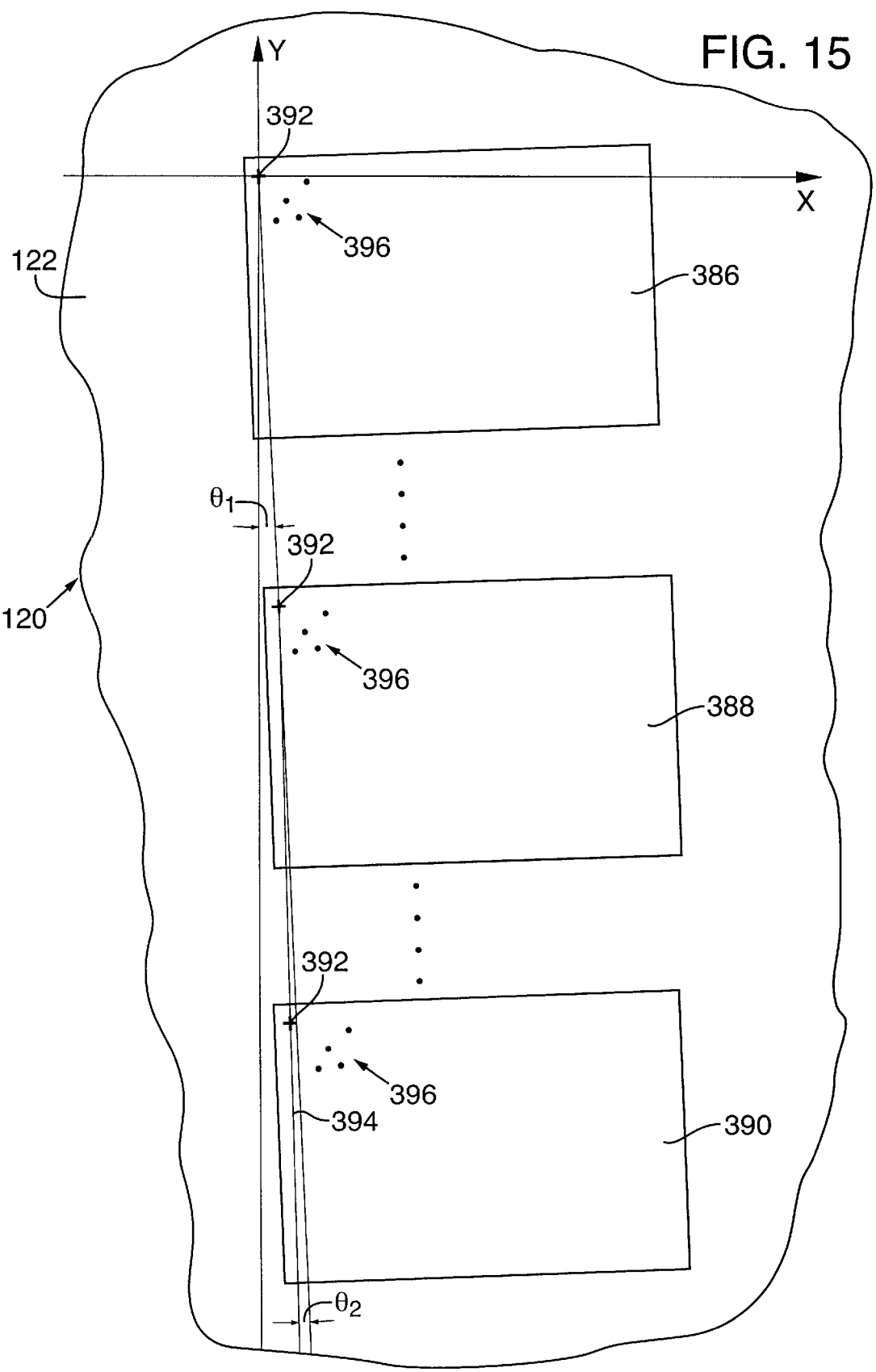
FIG. 15 schematically illustrates an uppermost die from a central die column of the wafer, an intermediate die from the same die column on the wafer, such as a die about one-third of the way down the wafer, and a lower die from the same die column, such as the lowermost die of the die column.

FIG. 15 schematically illustrates the dies 386, 388 and 390 with the intervening dies (represented by the ". . ." indications) being removed. In addition, an x-y coordinate system is shown on FIG. 15. This coordinate system corresponds to the x-y coordinate system of FIG. 1 along which scanning is to be accomplished. Each of the dies 386, 388 and 390 is provided in a conventional manner with alignment or locator marks such as indicated by 392 in the upper left-hand corner of each die. These locator marks, sometimes called fiducials or fiducial templates, may take various shapes, but provide a reference along which various components of circuitry laid out on the wafer die are at least in theory oriented. As can be seen in FIG. 15, the line 394 intersecting the fiducials is offset by an angle θ1 from the y-axis. By determining θ1, as explained below, a rotational adjustment of the chuck supporting stage (see e.g. 70 in FIG. 2) is determined. By rotating the chuck through the angle θ1, the fiducials become more closely aligned to the x-y scanning directions. In addition, it is possible for a particular layer, such as the mask which was used during laying down of bumps on the dies to be skewed relative to the fiducials. Illustrative patterns of bumps are shown at 396 on each of these dies. As can be seen in FIG. 15, the bump patterns have been skewed by an angle θ2 relative to the fiducials. By knowing θ2, one can track the correspondence between the expected locations of the bumps and the actual location of the bumps such that during scanning the microscope and camera assembly are focused on the location where the bumps should actually be located. Consequently, it is desirable to know the θ2 offset.

Figure 16:
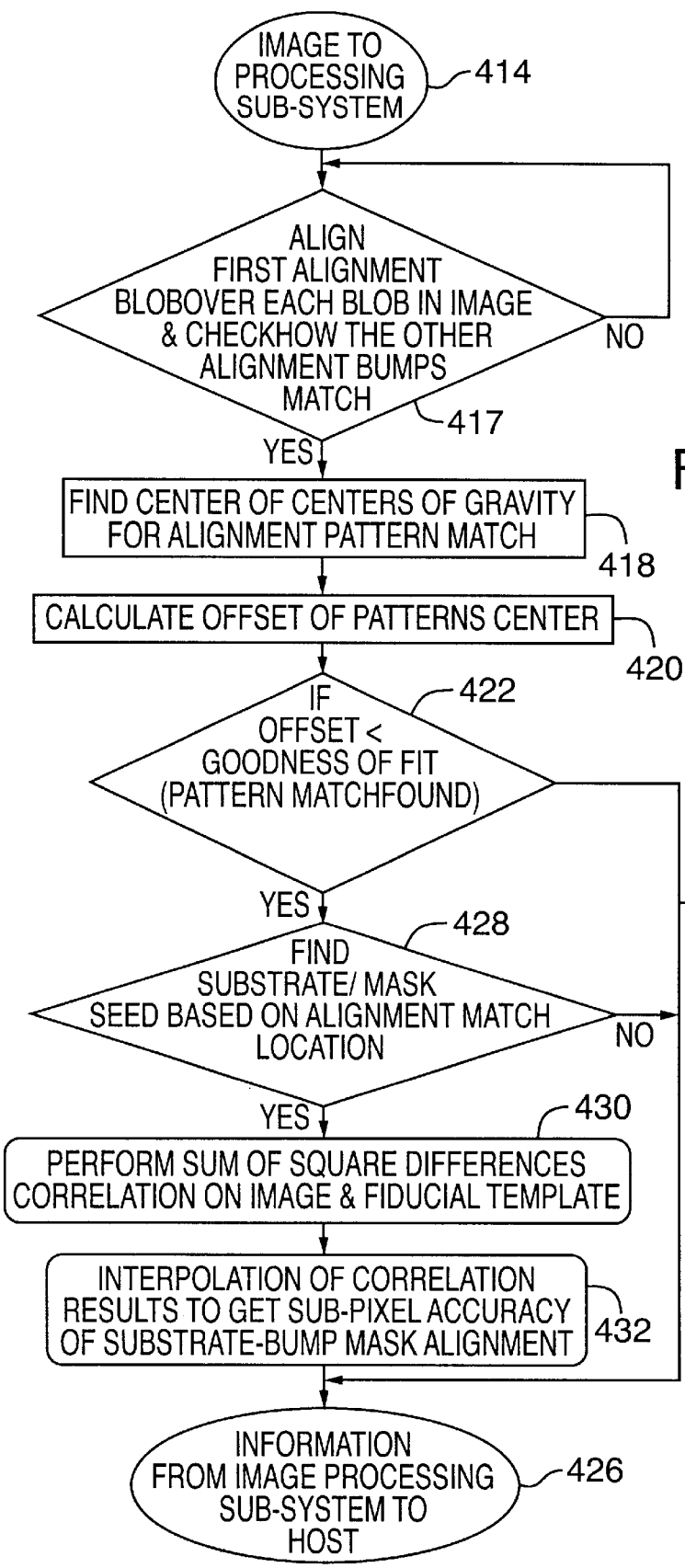
FIGS. 16 and 17 illustrate flow charts for one form of an alignment approach which may be used in determining the positioning of bumps relative to fiducials or other reference marks on the dies and which may be used in aligning the wafer for capturing image pixels corresponding to light patterns reflected from bumps on the wafer.
Figure 17:
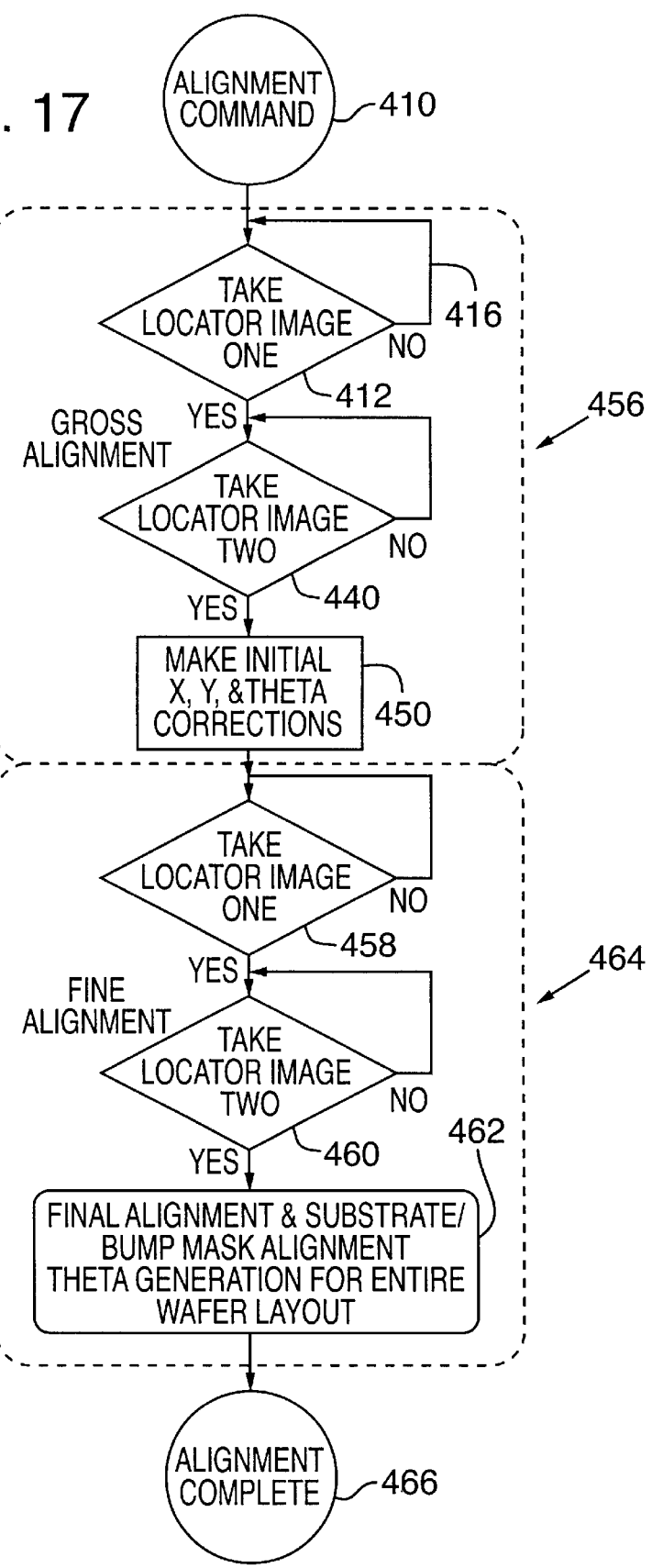

More specifically, an example of these alignment techniques will be understood with reference to FIGS. 16 and 17. Referring to FIG. 17, at block 410 an alignment command is received from the host computer indicating that the alignment sequence will commence. When in the alignment mode, the lights of illuminator 10 (FIG. 1) are typically turned off and the confocal or co-axial light source 110 is energized to direct light co-axially with the microscope axis toward the wafer surface. With light directed in this direction, the bumps formed on the wafer surface will appear dark as light impacting the bumps is typically deflected away from the camera sensing surface. In contrast, the wafer substrate will be relatively light. This makes the bumps and bump patterns readily apparent. In addition, the focus of the microscope can be blurred such that features on the wafer substrate other than projecting bumps become less discernible. However, the microscope when focused has about a one hundred micron depth of field in this example. The bumps are typically 35–75 microns high so that one can capture substrate or wafer surface features as well as bumps if desired.

For a particular product, the host computer may be trained to recognize particular patterns of bumps for the product and the location of the fiducial and template relative to the bump pattern. For purposes of discussion, one such bump pattern is indicated at 396 in FIG. 15 (a more complex pattern may be used). A particular die may be scanned to locate the matching bump pattern. Once the matching bump pattern has been found on the die, and given the expected relationship between the fiducial location and location of the bump pattern, one can search in a narrower area of interest for the actual fiducial or fiducial template. This results in a quicker location of fiducials and thereby speeds the wafer inspection process. This is in contrast to techniques where one looks at the location where the fiducial is expected and, if not found, one then traverses a spiral or other search pattern in an attempt to locate the fiducial. Thus, in one alignment or location technique, fiducials or alignment marks are more quickly located by first searching for and recognizing wafer bump patterns and then looking for the die alignment marks.

Referring again to FIG. 17, a first locator image is captured at block 412. The system then passes the captured image to an image processing subsystem and in particular to a block 414 of FIG. 16 for evaluation of the first locator image. The no-path 416 from block 412 of FIG. 17 is followed to repeat the take locator image one process prior to reaching block 414 of FIG. 16 in the event, for example, the camera did not take a picture or the stage did not move when it was supposed to. This may be repeated a number of times and if failure continues the process is interrupted. From block 414 of FIG. 16, a block 417 is reached. At block 417, a pattern match is sought. From the host computer, the image processing system knows the general area of interest for searching for a pattern match and how many bumps are in the pattern. In addition, the weighted center of gravity of the bumps of the pattern is known. At block 417, the first alignment bump or blob of the trained pattern is overlaid over a blob in the image from the picture (locator image one). The other alignment bumps of the pattern are then compared with the position of bumps in the captured locator image to see whether they match. The system is trained for a particular product such that desirably there is only one pattern match. Eventually, a pattern match is found and block 418 is reached. At block 418 the center of gravity of the centers of the bumps in the alignment pattern identified in the actual locator image picture is found. At block 420, the offset between the center of centers from the captured locator picture or image and the loaded weighted center is determined. At block 422, a determination is made as to whether the calculated offset is less than a threshold (e.g., 25 microns). If no, a branch 424 is followed to block 426 and the system returns to the host processor for capturing another picture for locator image 1. Typically, a pattern match will be found within the rough offset established by block 422 and a block 428 is reached.

At block 428, a question is asked as to whether the fiducial or alignment marks are positioned on the die where they were expected to be based on the product training. The mask seed in this block corresponds to the fiducial template. If the answer is no, the system proceeds to block 426. If the answer is yes, at block 430 a fine correlation is performed between the captured image and the fiducial template. Various approaches may be used for this fine correlation. Correlation to the pixel level is typically insufficient, that is at a 7.1 microns per pixel resolution. Although other approaches may be used, at block 430 a sum of square differences approach is utilized to obtain the correlation between the actual fiducial template on the captured image and trained fiducial template. At block 432, an interpolation is made of the correlation results to obtain a sub-pixel accuracy determination of the substrate/bump mask alignment. A polynomial fit may be used as well as other interpolation techniques. As a specific example, cubic spline interpolation may be used.

Following the processing of locator image 1 in the above manner, at block 426 certain location information is passed back to the host computer. For example, coordinates x1, y1 corresponding to the location where the reference mark was found in captured locator image 1 and the coordinates x1c, y1c corresponding to the location where the weighted center of the bump pattern was found in the first locator image may be passed back to the host computer. The processing returns to block 440 of FIG. 17 and the second locator image is taken. At the yes line from block 440, the low level inspection flow process of FIG. 16 is again reached such that the processing of the second locator image (e.g., locator image 2) is accomplished. In this case, assuming the match is found and another locator image 2 is not required, coordinates are again passed back to the host computer from the process of FIG. 16. These coordinates may be designated x2, y2 corresponding to the location where the reference mark was found and x2c, y2c corresponding to the location of where the weighted center of the pattern was found in the second image. At block 450, initial x, y and $\theta$ corrections are made and thus gross alignment is complete, as indicated by box portion 456 of the flow chart of FIG. 17. In this regard, the y-axis of the wafer coordinate system is typically shifted to match the y-axis of wafer scanning. This initial offset is obtained by subtracting x1c from x2c and y1c from y2c.

One may then move the weighted center of the pattern to the center of the image. At block 458, another locator image 1 is taken and processed in accordance with FIG. 16. Furthermore, another locator image 2 is taken at block 460 and processed in accordance with FIG. 16. At block 440, locator image 2 is typically taken of a die intermediate at the top and bottom of the wafer such as the die 388 in FIG. 15. At block 460, the locator image 2 is typically taken of a lower die, e.g., the die 390 at the bottom of the wafer. From the new x1, y1 and x2, y2 data for the reference marks, one can determine a new $\theta$ which can be used as an offset or used in determining a further motion of the wafer chuck support stage about the z-axis to compensate for this new $\theta$. That is, a $\theta$ rotation motor rotates the chuck supporting stage for fine alignment. This at block 462 the $\theta$ is generated for the entire wafer layout. Thus, the flow path indicated by box 464 of FIG. 17 constitutes a fine alignment flow path. The fine alignment flow path may be repeated one or more times to further refine the desired alignment of the x,y scanning direction with the fiducials or reference marks. In a typical application, fine alignment is accomplished in one or two passes through the flow block 464. At block 466, the alignment is complete and the wafer is in position for scanning to provide appropriate pixel information to the camera.

Figure 18:
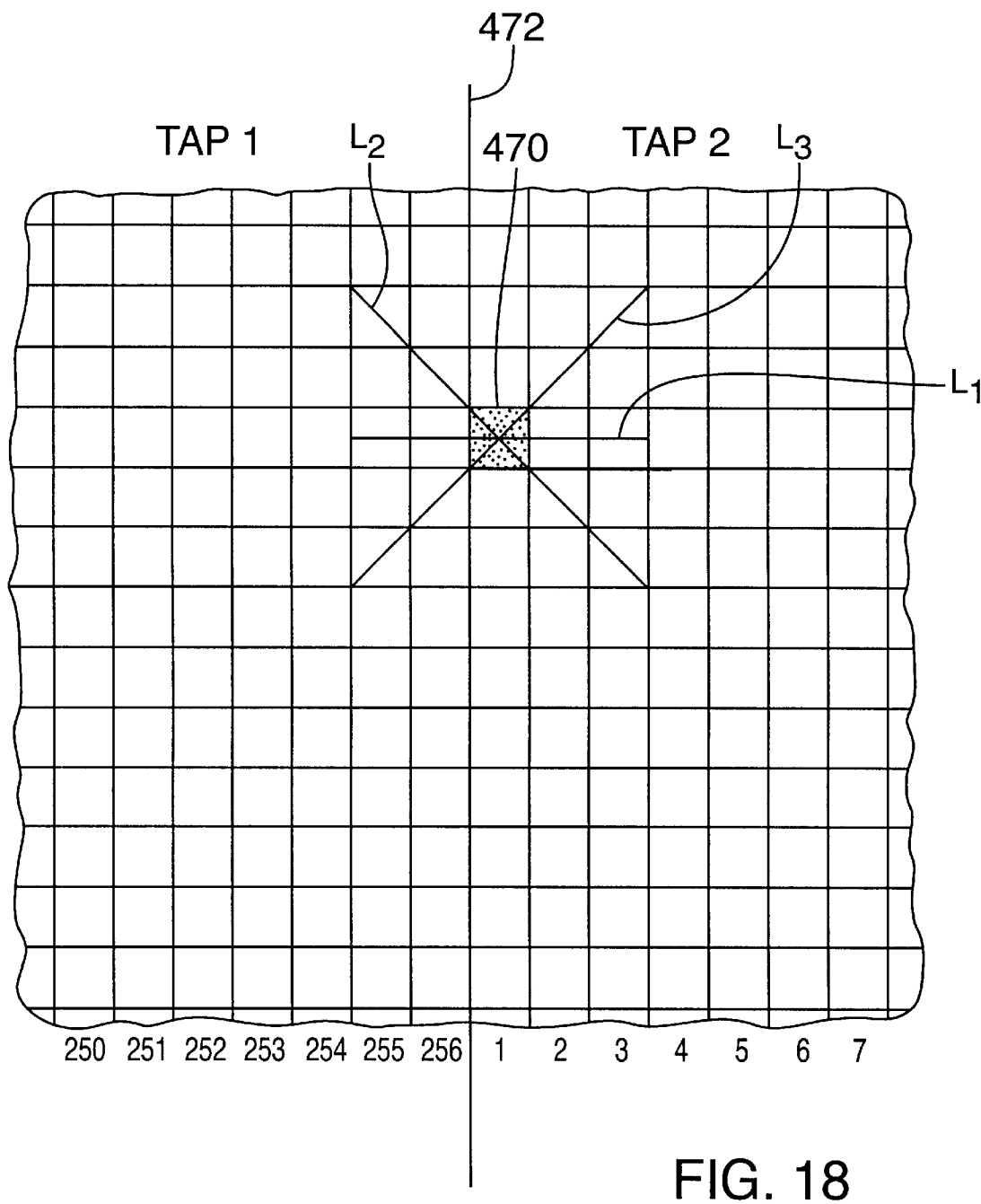
FIGS. 18 and 19 schematically illustrate an approach for assigning values to selected pixels in a captured image.

As previously mentioned, the use of a time delay and integration camera with a field of view wherein the field is broken up into taps may result in dead pixels. With reference to FIG. 18, a schematic representation is made of a field of view of one form of time delay and integration camera having a field of view which is divided into taps which are 256 pixels wide. As data is shifted out of the taps, one pixel (such as the first pixel of each row of a tap at which data transfer commences) may contain dead or erroneous data. To improve the accuracy of the overall apparatus employing this type of camera, one can apply an estimation technique to determine an estimated value for correct data in the dead pixels. Numerous estimation techniques may be used. For example, one may simply take the average value of adjoining pixels in a row and assign this value to the dead pixel. However, improved results have been obtained by utilizing the approach schematically represent in FIGS. 18 and 19, it being understood that these approaches are desirable, but optional.

In accordance with the approach of FIG. 18, a dead pixel is indicated at 470. This pixel is the first pixel of a row of tap 2 following the boundary between taps 1 and 2 indicated by line 472. The same analysis may be applied to assign a value to each first pixel of tap 2, tap 3, etc. through the last tap (e.g., tap 8 in the case of a camera having a field of view which is 2048 pixels wide). The technique of FIG. 19 is an alternative technique which may be applied to the pixels at and/or adjacent to the edges of the field of view of the camera.

With reference to FIG. 18, values for a dead pixel are estimated using values from plural preceding and plural succeeding adjoining columns. For example, for each pixel, a neighborhood of pixels is defined around the pixel for which the value is to be estimated. The neighborhood may be of any desired size, such as a 5×5 neighborhood immediately surrounding pixel 470 in FIG. 18. The gray level gradient is then computed in a plurality of directions with respect to the dead pixel. Since semiconductor wafers during processing often are given features or characteristics which extend vertically or horizontally along a die, simple averaging in a straight line in an x direction can result in significant errors. The technique outlined below results in a reduction of this error.

As a specific example, the gray level gradient may be calculated in three different directions corresponding to pixels intersected by lines L1, L2 and L3 with respect to the dead pixel. The direction along which the pixels exhibit the maximum gradient may then be determined. Thereafter, interpolation or estimation may be accomplished using pixels located along the direction of the maximum gradient to find an estimated value for the dead pixel. Various interpolation techniques may be used. As a specific example, one may utilize least square means interpolation to obtain the value for pixel 470 with the interpolation again being accomplished using pixel values along the line with the maximum gray line gradient.

Figure 19:
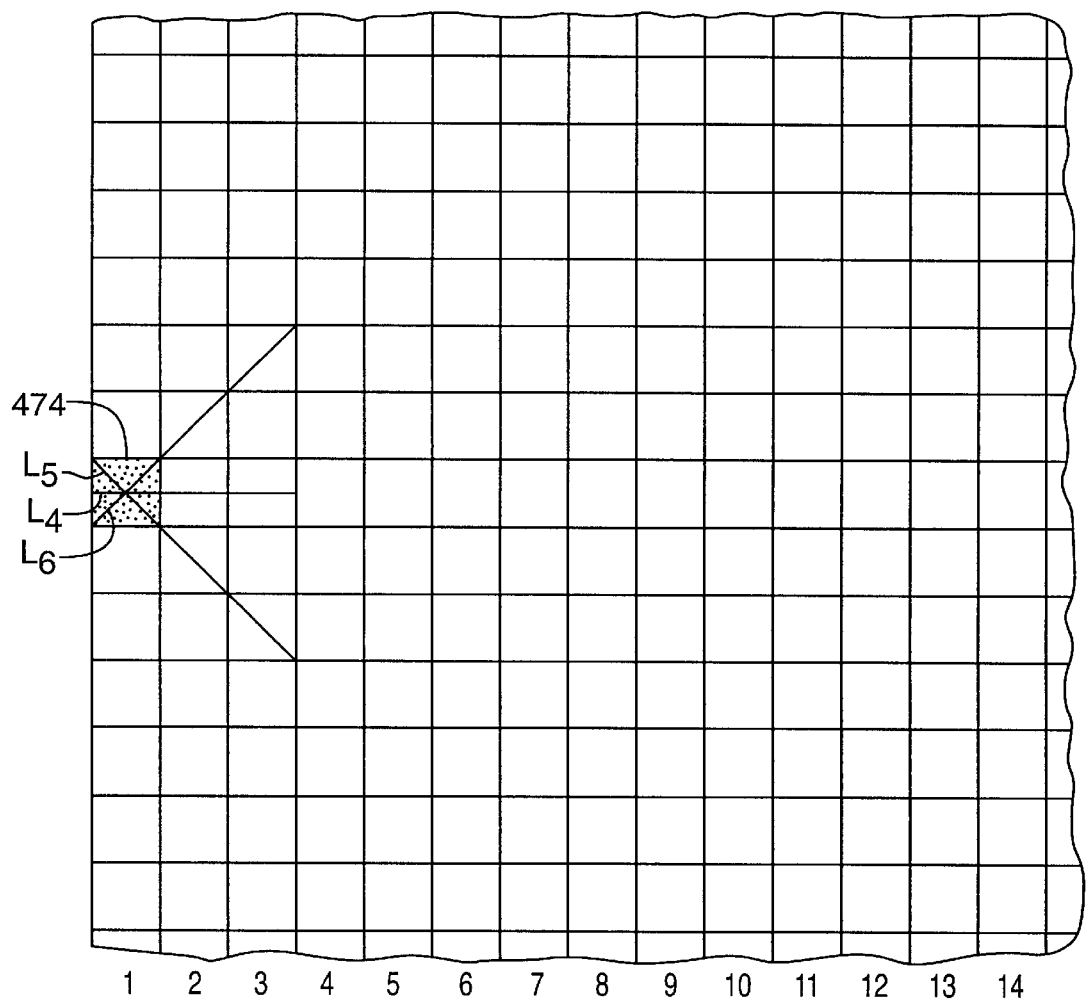

With reference to FIG. 19, at the last or next to last column of an image and/or at other edge locations, one is not able to establish a surrounding neighborhood as was done in the approach of FIG. 18. This is illustrated in FIG. 19. In this case, a neighborhood which is truncated in one direction where pixels are unavailable may be established with the neighborhood being of plural pixel length in the available directions. For example, a 3×5 neighborhood is shown in FIG. 19 around the dead pixel 474 in FIG. 19. Although another extrapolation method may be used, in one specific approach the gray line gradient is calculated in three different directions such as indicated by lines L4, L5 and L6 in FIG. 19. The direction with the maximum gray line gradient is then determined. Extrapolation may be performed along the direction of maximum gradient to find the estimated value for the dead pixel 474. For example, in one specific extrapolation approach, one may take the slope from the value of two pixels along the line of maximum gradient and determine the value for the dead pixel by assuming it lies along a straight line through the two points.

With reference to FIG. 2, the corrected pixels are captured by the frame grabber 142 and may be displayed as a visual image to an operator or otherwise processed by an automated image processing system to evaluate the bumps using the captured pixel data.

Figure 20:
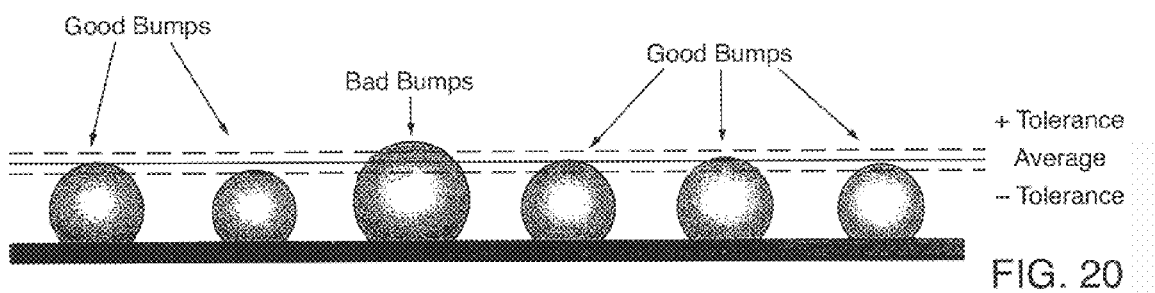
FIG. 20 illustrates a plurality of well formed or good bumps along with an oversized bump which is of a height outside tolerance ranges for good bumps.

FIG. 20 illustrates exemplary "good bumps" along with a "bad bump". In this case, the good bumps are those having a height within a tolerance range of the average height of the bumps. The bad bump is an oversized bump outside the tolerance ranges. In addition to other drawbacks, oversized bumps can interfere with electrical connections which need to be made to all of the bumps when the die is processed into a circuit.

Figure 21:
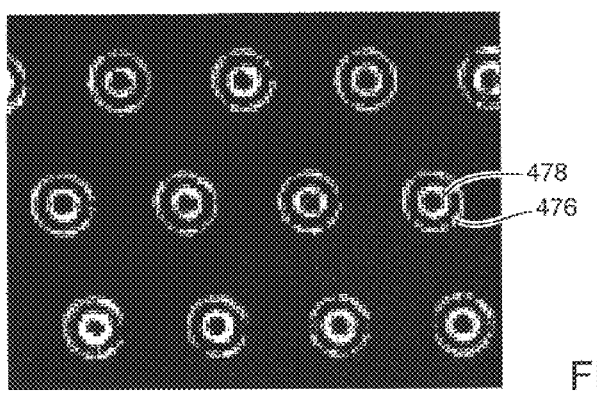
FIG. 21 illustrates reflected light patterns from well-formed bumps captured as pixel data and displayed visually.

FIG. 21 illustrates images captured by a time delay and integration camera when a forty-five degree light source was turned on. These images are of satisfactory bumps. As can be seen from FIG. 21, each of the images has an outer ring of indirect or ghost reflected light 476 and an inner ring of directly reflected light 478. The location of these rings and their brightness provides pixel information from which the bumps can be evaluated using a variety of processing techniques. For example, oxidation of the bumps can be determined by comparing the brightness of the rings of bumps at certain locations on a wafer with respect to the brightness of bumps at other locations along a wafer. The shape and positioning of the rings indicate the shape of the bump. In addition, the spacing between the rings indicates the size and other characteristics of the bump. Thus, this pixel information from captured images reflected from bumps is very useful. In examples where the first and second ring sources of light are used (e.g., the twenty and sixty degree light sources) without a third (e.g., the forty-five degree) ring source of light, the ring patterns reflected from good bumps are closer together but the pixel information is still useful in determining the desirable and undesirable properties of the bumps.

Figure 22:
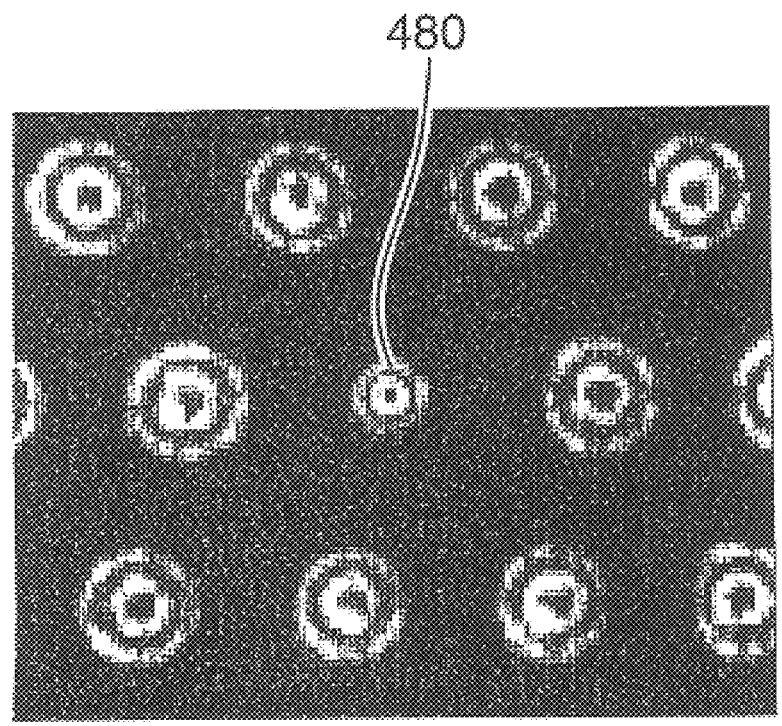
FIG. 22 illustrates the captured and displayed image of a plurality of well-formed bumps and of an undersized bump.

FIG. 22 shows a ring pattern from a forty-five degree ring light source for an undersized bump 480 (located approximately at the center of the center row of depicted bumps).

Figure 23:
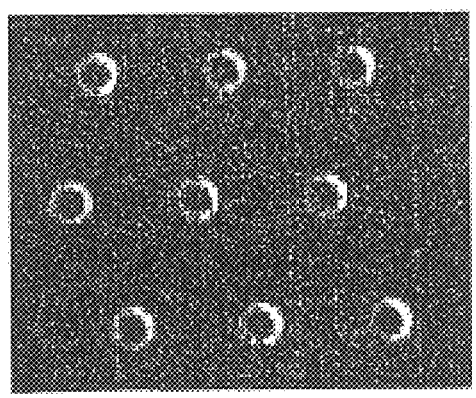
FIG. 23 illustrates a captured and displayed image of missing bumps.

FIG. 23 illustrates a ring pattern from a forty-five degree ring light source obtained when bumps are missing. In this case, the reflected light is from the wafer surface instead of having the double ring reflected pattern from a well-formed bump, such as shown in FIG. 21.

Figure 24:
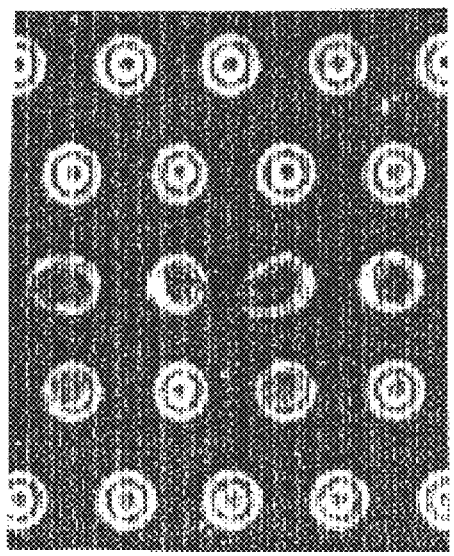
FIG. 24 illustrates a captured and displayed image of a plurality of well-formed bumps with a center row of scratched or deformed bumps.

FIG. 24 illustrates exemplary image displays of bumps which are scratched or otherwise deformed. These bumps are best seen in the center row of the image of FIG. 24. Again, the dual bump reflective pattern is missing. Also, the outer reflected light ring pattern is distorted in many cases.

Figure 25:
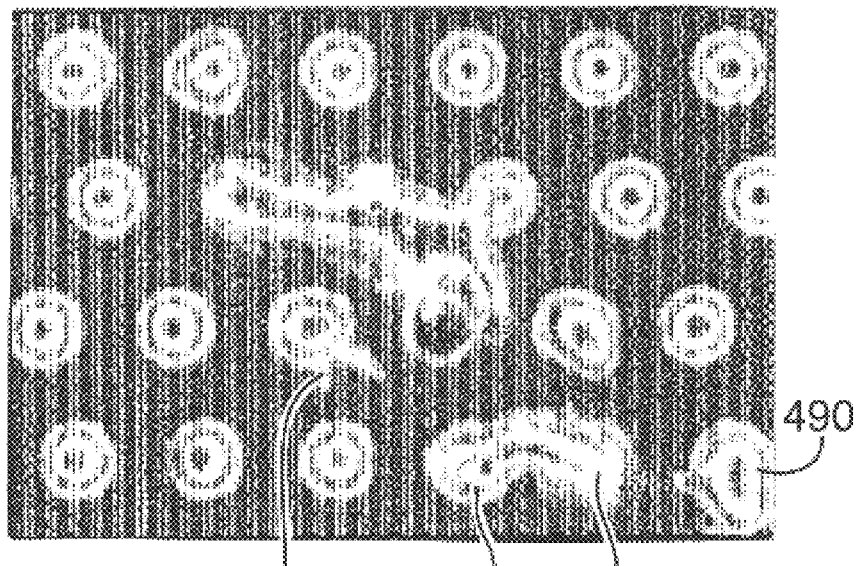
FIG. 25 illustrates a captured and displayed image showing a plurality of well formed bumps together with several bumps having a shape other than rounded, bridging and shorting between the number of bumps, and nodules or contaminants on several bumps.

FIG. 25 illustrates captured images which show a number of deformed bumps, e.g., bump 490, and bumps with contaminants or projections from the bump, e.g., bump 492. In addition, FIG. 25 illustrates a number of bumps which are shorted out or bridged by material between the bumps, such as bumps 494 and 496 in FIG. 25.

Thus, as is apparent from these figures, the captured image pixel information may be used to evaluate the bump characteristics.

Having illustrated and described the principles of our invention with reference to several desirable embodiments, it should be apparent to those of ordinary skill in the art that the invention may be modified in arrangement and detail without departing from these principals. We claim as our invention all such modifications as fall within the scope and spirit of the following claims.

We claim:

1. An apparatus for directing light toward at least one light reflective bump formed on a first wafer surface of a semiconductor wafer, the apparatus comprising:
   a light source support;
   at least a first light source carried by the light source support for directing a first ring pattern of light toward the bump on the first wafer surface; and
   at least a second light source carried by the light source support for directing a second ring pattern of light toward the bump.

2. An apparatus according to claim 1 in which the intensity of light from the first light source is adjustable and in which the intensity of light from the second light source is adjustable.

3. An apparatus according to claim 1 in which the first wafer surface is in a first wafer plane, the first light source directing a ring pattern of light toward the bump at a first angle of incidence relative to the first wafer plane, the second light source directing a ring pattern of light toward the bump at a second angle of incidence relative to the first wafer plane, the second angle of incidence being different than the first angle of incidence.

4. An apparatus according to claim 3 comprising at least a third light source for directing a ring pattern of light toward the bump at a third angle of incidence relative to the first wafer plane, the third angle of incidence being different than the first and second angles of incidence.

5. An apparatus according to claim 4 wherein the first angle of incidence is between about eighteen degrees and twenty-two degrees, the second angle of incidence is between about fifty-eight degrees and sixty-two degrees, and the third angle of incidence is between about forty-three degrees and about forty-seven degrees.

6. An apparatus according to claim 5 wherein the first angle of incidence is twenty degrees, the second angle of incidence is sixty degrees, and the third angle of incidence is forty-five degrees.

7. An apparatus according to claim 3 wherein the first angle of incidence is between about eighteen degrees and twenty-two degrees and the second angle of incidence is between about fifty-eight degrees and sixty-two degrees.

8. An apparatus according to claim 1 wherein the light support includes a first annular light supporting section for carrying the first light source and a second annular light supporting section for carrying the second light source.

9. An apparatus according to claim 8 wherein the first light source comprises a plurality of discrete lighting elements distributed about the first annular light supporting section and the second light source comprises a plurality of discrete lighting elements distributed about the second annular light supporting section.

10. An apparatus for directing light toward at least one light reflective bump formed on a first wafer surface of a semiconductor wafer, the apparatus comprising:
   a first set of a plurality of first light emitting diodes arranged in a ring to emit light in a first light source plane, and
   a second light source comprising a second set of a plurality of second light emitting diodes arranged in a ring to emit light in a second light source plane, the first wafer surface being planar and in a plane which is parallel to the first and second light source planes.

11. An apparatus according to claim 10 in which the intensity of light from the first set of first light emitting diodes is independently adjustable from the intensity of light from the second set of second light emitting diodes.

12. An apparatus according to claim 10 in which the light emitting diodes emit red light.

13. An apparatus according to claim 10 in which at least a majority of the light emitting diodes emit red light.

14. An apparatus according to claim 10 in which the light emitting diodes have a narrow focus of no greater than about fifteen degrees.

15. An apparatus for directing light toward a wafer surface of a semiconductor wafer, the apparatus comprising at least a first ring of light sources and a second ring of light sources, the first and second rings of light sources being supported at locations such that the rings are spaced apart from one another and from the wafer surface, the intensity of the light from the first and second rings of light sources being independently adjustable.

16. An apparatus according to claim 15 comprising at least one third ring of light sources supported at a location intermediate to the first and second ring of light sources, the intensity of light from the third ring of light sources being independently adjustable from the intensity of light from the first and second rings of light sources.

17. An apparatus for directing ring patterns of light toward a wafer surface of a semiconductor wafer, the apparatus comprising a light support with at least a first set of bores arranged in a first ring pattern, at least one first ring of light sources comprising a first set of light emitting diodes each positioned within a respective bore of the first set of bores, the light support also comprising at least a second set of bores arranged in a second ring pattern, at least one second ring of light sources comprising a second set of light emitting diodes each positioned within a respective bore of the second set of bores.

18. An apparatus according to claim 17 in which the first and second sets of light emitting diodes each comprise plural light segments having a base with plural light emitting diodes carried by the base, each light segment emitting light of an intensity which is independently adjustable from the intensity of the light from the intensity of light from the other light segments.

19. An apparatus according to claim 18 in which the light support comprises at least a third set of bores arranged in a third ring pattern, at least one third ring of light sources comprising a third set of light emitting diodes each positioned within a respective bore of the third set of bores.

20. An apparatus according to claim 19 in which the wafer surface is planar and the light support carries the respective first, second and third sets of light emitting diodes each in a respective plane which is parallel to the wafer surface.

21. An apparatus according to claim 20 in which the light support is generally frustoconical in overall shape.

22. An apparatus for directing light toward at least one light reflective bump formed on a wafer surface, the apparatus including at least first, second and third ring light sources, the third ring light source being intermediate to the second ring light source, the ring light sources selectively directing rings of light toward the bump, the first and second ring light sources simultaneously directing light toward the bump with the third ring light source being off under first wafer conditions and the third ring of light directing light toward the bump with the first and second ring light sources being off under second wafer conditions.

23. An apparatus according to claim 22 wherein the first wafer conditions comprise a relatively low reflective wafer surface which reduces the reflection of light from the third ring light source from the wafer surface toward the bump.

24. An apparatus according to claim 22 wherein the first wafer conditions comprise relatively tightly packed bumps on the wafer surface which interfere with the reflection of light from the third ring light source to the bump.

25. An apparatus according to claim 23 wherein the first wafer conditions comprise relatively tightly packed bumps on the wafer surface which interfere with the reflection of light from the third ring light source to the bump.

26. An apparatus according to claim 22 wherein the second wafer conditions comprise a relatively highly reflective wafer surface and relatively distantly spaced bumps such that light from the third ring light source reflects from the wafer surface to the bump without substantial blockage by nearby bumps.

27. An apparatus according to claim 22 in which the intensity of light from the first, second and third ring light sources is independently adjustable.

28. An apparatus for directing light toward at least one light reflective bump formed on a first wafer surface of a semiconductor wafer comprising:
   a light source support;
   at least a first light source carried by the light source support for directing a first ring pattern of light toward the bump on the first wafer surface;
   at least a second light source carried by the light source support for directing a second ring pattern of light toward the bump;
   in which the first wafer surface is in a first wafer plane, the first light source directing a ring pattern of light toward the bump at a first angle of incidence relative to the first wafer plane, the second light source directing a ring pattern of light toward the bump at a second angle of incidence relative to the first wafer plane, the second angle of incidence being different than the first angle of incidence;
   at least a third light source for directing a ring pattern of light toward the bump at a third angle of incidence relative to the first wafer plane, the third angle of incidence being different than the first and second angles of incidence;

wherein the first angle of incidence is between about eighteen degrees and twenty-two degrees, the second angle of incidence is between about fifty-eight degrees and sixty-two degrees, and the third angle of incidence is between about forty-three degrees and about forty-seven degrees;

wherein the intensity of the light from the first, second and third light sources is adjustable;

the light support comprising at least first set of bores arranged in a first ring pattern, the first light source comprising a first set of light emitting diodes each positioned within a respective bore of the first set of bores, the light support also comprising at least a second set of bores arranged in a second ring pattern, the second light source comprising a second set of light emitting diodes each positioned within a respective bore of the second set of bores; the light support comprising at least a third set of bores arranged in a third ring pattern, at least a third ring of light sources comprising a third set of light emitting diodes each positioned within a respective bore of the third set of bores;

wherein the wafer surface is planar and the light support carries the respective first, second and third sets of light emitting diodes each in a respective plane which is parallel to the wafer surface;

the first and second ring light sources selectively and simultaneously directing light toward the bump with the third ring of light sources being off under first wafer conditions and the third light source directing light toward the bump with the first and second light sources being off under second wafer conditions; and wherein the first wafer conditions comprise either or both a relatively low reflective wafer surface and relatively tightly packed bumps on the wafer surface which interfere with the reflection of light from the third ring light source to the bump, and wherein the second wafer conditions comprise a relatively highly reflective wafer surface and relatively distantly spaced bumps such that light from the third light source reflects from the wafer surface to the bump without substantial blockage by nearby bumps.

29. An apparatus for directing light toward at least one light reflective bump formed on a first wafer surface of a semiconductor wafer, the apparatus comprising:

means for selectively and simultaneously directing light from first and second ring light sources toward the bump; and means for independently adjusting the intensity of light from the respective first and second ring light sources.

30. A method of directing light toward at least one reflective bump on a semiconductor wafer surface, the method comprising:

selectively directing light from a first ring light source toward the bump to provide a first ring light pattern on the bump if the bump is well formed; and selectively directing light from a second ring light source toward the bump while the first ring light source directs light toward the bump to provide a second ring light pattern on the bump if the bump is well formed.

31. A method according to claim 30 comprising the act of adjusting the intensity of light from at least one of the first and second ring light sources relative to the intensity of light from the other ring light source.

32. A method according to claim 30 comprising:

alternately selectively directing light from a third ring light source toward the bump to form a third ring pattern of light on the bump and a reflected ring pattern of light on the bump and turning off the first and second ring light sources.

33. A method of reflecting light from at least one bump on a semiconductor wafer surface, the method comprising:

directly reflecting first ring pattern of light from the bump at least if the bump is well formed; and adjusting the relative intensity of the first and second reflected ring patterns of light.

34. A method according to claim 33 comprising the act of simultaneously directly reflecting a second ring pattern of light from the bump at least if the bump is well formed.

35. A method according to claim 33 comprising the act of stopping the reflection of the first and second ring patterns of light and directly reflecting a third ring pattern of light from the bump at least if the bump is well formed and indirectly reflecting a fourth ring pattern of light from the bump at least if the bump is well formed.

* * * * *

UNITED STATES PATENT AND TRADEMARK OFFICE
CERTIFICATE OF CORRECTION

PATENT NO.    : 6,547,409 B2
DATED         : April 15, 2003
INVENTOR(S)   : Kiest et al.

Page 1 of 1

It is certified that error appears in the above-identified patent and that said Letters Patent is hereby corrected as shown below:

<u>Column 13,</u>
Line 34, "a" should be -- α --

Signed and Sealed this

Tenth Day of February, 2004

JON W. DUDAS
*Acting Director of the United States Patent and Trademark Office*